United States Patent [19]

Pissanetzky

[11] Patent Number: 5,382,904

[45] Date of Patent: Jan. 17, 1995

[54] STRUCTURED COIL ELECTROMAGNETS FOR MAGNETIC RESONANCE IMAGING AND METHOD FOR FABRICATING THE SAME

[75] Inventor: Sergio Pissanetzky, The Woodlands, Tex.

[73] Assignee: Houston Advanced Research Center, The Woodlands, Tex.

[21] Appl. No.: 926,667

[22] Filed: Aug. 6, 1992

Related U.S. Application Data

[63] Continuation-in-part of Ser. No. 869,544, Apr. 15, 1992.

[51] Int. Cl.⁶ .................................................. G01V 3/00
[52] U.S. Cl. .................................... 324/319; 324/320; 335/296; 29/602.1
[58] Field of Search ............... 324/300, 307, 309, 318, 324/319, 320; 335/299, 296; 29/602.1

[56] References Cited

U.S. PATENT DOCUMENTS

| | | | |
|---|---|---|---|
| 4,689,591 | 8/1987 | McDougall | 335/299 |
| 4,701,736 | 10/1987 | McDougall et al. | 335/299 |
| 4,721,914 | 1/1988 | Fukushima et al. | 324/320 |
| 4,724,412 | 2/1988 | Kalafala | 324/320 |
| 4,968,915 | 11/1990 | Wilson et al. | 313/62 |
| 5,003,979 | 4/1991 | Merickel et al. | 128/653 |
| 5,006,804 | 4/1991 | Dorri et al. | 324/320 |
| 5,012,217 | 4/1991 | Palkovich et al. | 335/301 |
| 5,049,848 | 9/1991 | Pulyer | 335/296 |
| 5,117,188 | 5/1992 | Ohkawa | 324/318 |

FOREIGN PATENT DOCUMENTS 9101564  2/1991  WIPO .

OTHER PUBLICATIONS

M. W. Garrett, "Thick Cylindrical Coil Systems for Strong Magnetic Field or Gradient Homogeneities of the 6th to 20th Order.", *J. Appl. Phys.* vol. 38, No. 6, (1967) pp. 2578-2583.

Pissanetzky, "Minimum energy MRI gradient coils of general geometry", *Meas. Sci. Technol.*, vol. 3 (IOP Publishing Ltd., 1992) pp. 667-673.

Pissanetzky, "Structured coils for NMR applications" *IEEE Trans. Magentics*, vol. 28, No. 4 (IEEE, Jul. 1992), pp. 1961-1968.

Pissanetzky, "Structured Coils and Nonlinear Iron", presented at the 5th Biennial IEEE Conference on Electromagnet Field Computation, Clarement, Calif. (Aug. 3-5, 1992).

*Primary Examiner*—Louis Arana
*Attorney, Agent, or Firm*—Vinson & Elkins

[57] ABSTRACT

Superconducting electromagnets suitable for use in the NMR tomography of human organs, and a method of making the same, are disclosed. Each of the disclosed electromagnets are constructed according to a structured coils methodology, where the desired field at locations within the volume of interest and, optionally, outside of the location of the coils is selected; the current magnitude and polarity for a plurality of coil elements locations are then optimized, by way of a computer program, to provide the desired field magnitude at the locations. The magnet construction results in a plurality of coils of varying current polarity, and of irregular shape and size, optimized to provide the uniform field. Magnets may be constructed according to the present invention which provide suitably highly uniform and high magnitude DC magnetic fields at volumes of interest which may be within or outside of the magnet bore, enabling the MRI of human organs without requiring whole body insertion of the patient into the magnet bore.

28 Claims, 13 Drawing Sheets

STRUCTURED COIL ELECTROMAGNETS FOR MAGNETIC RESONANCE IMAGING AND METHOD FOR FABRICATING THE SAME

This application is a continuation-in-part of application Ser. No. 869,544, filed Apr. 15, 1992 in the name of Sergio Pissanetzky, and entitled "An Ultrashort Cylindrical Shielded Electromagnet For Magnetic Resonance Imaging", commonly assigned herewith and incorporated herein by reference.

This invention is in the field of electromagnets, and is more particularly directed to superconducting electromagnets useful in magnetic resonance imaging.

BACKGROUND OF THE INVENTION

High magnetic field electromagnets have become important in various types of equipment over recent years. One important type of such equipment is medical imaging equipment, such as the type commonly referred to as magnetic resonance imaging (MRI) equipment. MRI equipment utilizes the mechanism of nuclear magnetic resonance (NMR) to produce an image, and accordingly imaging systems operating according to this mechanism are also commonly referred to as NMR imaging systems.

As is well known in the field of MRI, a high DC magnetic field is generated to polarize the gyromagnetic atomic nuclei of interest (i.e., those atomic nuclei that have nonzero angular momentum, or nonzero magnetic moment) contained within the volume to be imaged in the subject. The magnitude of this DC magnetic field currently ranges from on the order of 0.15 Tesla to 2.0 Tesla: it is contemplated that larger fields, ranging as high as 4.0 to 6.0 Tesla, may be useful in the future, particularly to perform spectroscopy as well as tomography. The volume of the subject to be imaged (i.e., the volume of interest, or "VOI") is that volume which receives the high DC magnetic field, and within which the DC field is substantially uniform.

Imaging is accomplished in the VOI utilizing the mechanism of nuclear magnetic resonance in the gyromagnetic atomic nuclei contained therewithin. As such, in addition to the large field DC magnet, the MRI apparatus includes an oscillator coil to generate an oscillating magnetic field oriented at an angle relative to the DC field, and at a frequency matching the resonant frequency of the atoms of interest in the selected volume; frequencies of interest in modern MRI are in the radio frequency (RF) range. As the gyromagnetic nuclei in the defined volume will have a common resonant frequency different from atoms outside of the volume, modulation of a gradient magnetic field (produced by a gradient coil) allows sequential imaging of small volumes. The images from the small volumes are then used to form a composite image of the larger volume, such as the internal organ or region of interest. To produce the series of images, the MRI apparatus also includes a detecting coil in which a current can be induced by the nuclear magnetic dipoles in the volume being imaged.

In operation, as is well known, the magnetic dipole moments of those atoms in the volume which are both gyromagnetic and also resonant at the frequency of the oscillating field are rotated from their polarized orientation by the resonant RF oscillation by a known angle, for example 90°. The RF excitation is then removed, and the induced current in the detecting coil is measured over time to determine a decay rate, which corresponds to the quantity of the atoms of interest in the volume being imaged. Incremental sequencing of the imaging process through the selected volume by modulations in the gradient field can provide a series of images of the subject that correspond to the composition of the subject. Conventional MRI has been successful in the imaging of soft tissues, such as internal organs and the like, which are transparent to X-rays.

It is well known in the art that the spatial resolution of MRI tomography improves as the strength of the available magnetic field increases. Conventional MRI equipment useful in diagnostic medical imaging requires high DC magnetic fields, such as 5 kgauss or greater.

Due to the large number of ampere-turns necessary to produce such high magnetic fields, conventional MRI systems now generally utilize superconducting wire in their DC coils. While the magnitude of the current carried in these coils is extremely high, the superconducting material and accompanying cryogenic systems required in such magnets are quite expensive, and also add significantly to the size and weight of the magnet in the MRI apparatus. In the extreme case, some conventional MRI magnets are sufficiently heavy (e.g., on the order of twenty tons) as to limit the installation of the MRI apparatus to a basement or ground floor laboratory. Addition of the necessary coils or iron required to shield the fringe magnetic field generated by such magnets further increases the size, weight and manufacturing costs of the MRI equipment.

By way of background, U.S. Pat. No. 4,783,628 (issued Nov. 8, 1988) and U.S. Pat. No. 4,822,772 (issued Apr. 18, 1989), both incorporated herein by this reference and commonly assigned with this application, describe superferric shielded superconducting magnets. These magnets described in these patents utilize passive shielding of ferromagnetic material, such as iron. The construction of the magnets described in these patents provide a highly efficient magnet, considering the magnetic field strength as a function of the current conducted in the superconducting loops, and with a highly uniform field in the magnet bore even at very strong magnetic fields such as on the order of 4 Tesla; the shielding is also very good in this magnet, with the 5 gauss line at 50 to 100 cm from the outer wall of the bore. The weight and size of the superferric shielded magnets described in U.S. Pat. Nos. 4,783,628 and 4,822,772 can be quite substantial, however, such as on the order of 35 to 130 tons.

Another example of a conventional superconducting magnet, but which relies substantially on active superconducting shielding loops is described in U.S. Pat. No. 4,595,899. The magnet disclosed in this reference has a set of three driving coils surrounded by three shielding coils, with the current through the shielding coils adjusted to exactly cancel the dipole outside of the magnet. External ferromagnetic shielding is also located around the shielding coils to assist in further shielding. Examples of other prior magnets used in MRI are described in U.S. Pat. No. 4,612,505, in which shielding is accomplished by way of magnetic soft iron rods, conducting coils, or both; U.S. Pat. No. 5,012,217, issued Apr. 30, 1992, describes yet another prior superconducting magnet utilizing a combination of active and passive shielding.

While actively shielded magnets greatly reduce the magnet weight relative to superferric shielded magnets, the weight of these magnets is still quite substantial, for example on the order of 20 tons. As a result, when used in medical equipment such as NMR stations, the "footprint" required for installation of the magnet and the weight-bearing capability of the floor of the room are both significant, whether the magnet is constructed of the superferric type, the actively shielded type, or a combination of the two. As a result, from the cost standpoint, it is desirable to reduce the physical size and weight of NMR equipment, to reduce the cost of the NMR laboratory.

In addition to the undesirably large footprint of conventional NMR magnets for medical MRI, a further disadvantage of conventional magnets is patient-related. It has been observed that many patients are uncomfortable when placed in magnets of such length, as the patient's entire body is generally disposed within the magnet during much of the imaging procedure. Indeed, conventional cylindrical NMR magnets have been referred to as "tunnel" magnets, suggestive of the sensation perceived by the human subject when placed inside for an imaging procedure. As an example of the importance of reducing this sensation, U.S. Pat. No. 4,924,185 discloses, relative to another cylindrical superconducting magnet design, that the sense of oppression on the part of the patient is reduced as the ratio of bore length to bore diameter is below 1.90. In addition, especially for patients who are seriously ill, it is essential that the magnet be able to receive the patient without requiring disconnecting life support or monitoring conduits from the patient, and while allowing medical personnel to access the patient during the procedure; conventional cylindrical magnets greatly limit such access.

Accordingly, it is highly desirable to provide NMR tomography equipment of the minimum size but with adequate field strength and uniformity. Toward this end, copending application Ser. No. 715,552, filed Jun. 14, 1991, entitled "A Compact Shielded Superconducting Electromagnet", incorporated herein by this reference and commonly assigned herewith, describes another cylindrical superconducting magnet which advantageously uses a combination of superferric shielding outside of the shielding coils. The magnet disclosed therein thus can be shorter in length while still providing high DC field in the bore and low fringe field away from the magnet.

Copending application Ser. No. 869,544, filed Apr. 15, 1992 in the name of Sergio Pissanetzky, and entitled "An Ultrashort Cylindrical Shielded Electromagnet For Magnetic Resonance Imaging", commonly assigned herewith, incorporated hereinabove by reference, and being the parent of this continuation-in-part application, discloses a short cylindrical superconducting magnet useful in NMR imaging equipment. This application further discloses an important methodology used to design the coils in the DC field generating magnet in such a manner as to optimize the strength and uniformity of the field in the volume of interest (VOI) while maintaining low fringe fields away from the bore. As will be described in further detail hereinbelow, this methodology also proves useful in the design of magnets of other shapes.

By way of further background, U.S. Pat. No. 4,689,591 discloses a superconducting magnet having a plurality of coaxial coils arranged asymmetrically along the axis, resulting in a volume of interest that is offset from the midplane of the magnet. The volume of interest in this magnet, while offset, remains deeply within a cylindrical bore, however, requiring whole body insertion of the patient for MRI procedures.

Another known type of conventional MRI magnet is of the Helmholtz coil type, including such a magnet which utilizes thermally insulated niobium/tin superconducting material. However, this magnet also requires the patient's whole body to be inserted between the Helmholtz coils.

By way of further background, U.S. Pat. No. 5,049,848, issued Sep. 17, 1991, discloses a magnet configuration suited for MRI in mammography. This magnet configuration is of rectangular shape, and includes permanent magnets (5, 6, 7, 8) for generating magnetic flux in two planes in the gap g within which the imaging is to take place. A shimming electromagnet (14) is disclosed as being placed behind the patient, for reducing front edge fringe field.

By way of further background, notched cylindrical coil systems for providing strong magnetic fields are known, as described in M. W. Garrett, "Thick Cylindrical Coil Systems for Strong Magnetic Fields with Field or Gradient Homogeneities of the 6th to 20th Order", *J. Appl. Phys.*, Vol. 38, No 6 (1967), pp. 2563-86. As described in this reference at pages 2578-2583, expansion of ideal magnet elements to larger cross sections by modifying the geometry in an iterative fashion according to Lyle's Principle can be used to arrive at a magnet having a negative current polarity notch or cavity coil within the otherwise cylindrical positive coil; the notch may be at either the inner or the outer radial surface (see FIG. 2 of the reference), or even wholly within the positive coil.

In the method described in the above-cited Garrett article and also according to other conventional methods for designing cylindrical magnets, the designer relies on the property that the axial component of the magnetic field in the bore is a harmonic function within the volume of interest (VOI), which can be expanded into a series of spherical harmonics. The coefficients of this expansion may be expressed as axial derivatives of the axial magnetic field at the origin (center of the VOI). If one assumes that the current density in the cross-section of each magnet coil is constant, these axial derivatives may be calculated directly from coil geometry, without requiring integration of the Biot-Savart Law, allowing the geometry of the magnet to be adjusted so that the undesirable harmonics of the axial field in the VOI vanish. According to this generalized technique, computer-ready methods have been developed as have tabular design conditions (see the Garrett article cited above), facilitating the design of such magnets. This general method constrains the location of the VOI to a high degree, however, in order for the calculations to be readily performed; as such, this general method is practically applicable for a VOI centered at the midplane of the cylindrical magnet.

It is an object of the present invention to provide a method of fabricating an electromagnet for optimizing the field strength and uniformity in a selected volume of interest.

It is a further object of the present invention to provide such a method of fabricating a magnet which is applicable to magnets of various symmetry, including cylindrical and planar magnets.

It is a further object of the present invention to provide a magnet constructed according to such a method.

It is a further object of the present invention to provide such a magnet which allows for optimization of the design for a volume of interest which is not necessarily centered within the magnet bore.

It is a further object of the present invention to provide such a method which allows the center of the volume of interest to be located outside of the magnet bore.

It is a further object of the present invention to provide a superconducting magnet for use in NMR equipment which does not require insertion of the body of the patient into the magnet bore.

It is a further object of the present invention to provide such a magnet which is of sufficient field strength to enable in vivo NMR tomography of the internal organs of humans.

It is a further object of the present invention to provide such a magnet which is suitable for the image of specific organs, such as the brain, the female breast, and the like.

It is a further object of the present invention to provide such a magnet which makes the NMR tomography equipment substantially portable.

Other objects and advantages of the present invention will be apparent to those of ordinary skill in the art having reference to the following specification together with the drawings.

SUMMARY OF THE INVENTION

The invention may be implemented into a superconducting magnet useful in the NMR tomography of human organs, and a method of fabricating the same. According to the method of the present invention, the field magnitude is set for particular target locations within the volume of interest, and also outside of the magnet. Beginning with an initial condition of current density for cross-sectional coil elements, the error term between the calculated magnetic field and the desired magnetic field is minimized for each of the target locations, by changing the current density in each of the coil elements between maximum and minimum values. As in many cases the current density for neighboring coil elements tend toward the same limit, the resulting construction of the magnet is facilitated. This method enables the construction of magnets in which the volume of interest may be positioned at locations offset from the center of the magnet bore, including at locations where the center of the volume of interest is outside of the bore. MRI systems incorporating magnets according to the present invention thus allow for in vivo imaging of human organs without requiring whole-body insertion of the patient into the bore, thus greatly reducing the discomfort level of the patient during tomography procedures.

DETAILED DESCRIPTION OF THE PREFERRED EMBODIMENTS

As noted above, the present invention is directed to superconducting magnets, and methods of fabricating the same, capable of providing high uniformity magnetic fields within a volume of interest as is useful in magnetic resonance imaging (MRI). The following description is intended to present a full description of the invention by way of three exemplary embodiments, each of which is separately presented hereinbelow.

It should further be noted that the method of fabricating a magnet according to the present invention, as described hereinbelow, is applicable not only to cylindrical magnets, but may also be used for magnets of other symmetry. For example, in long magnets of the type used in particle accelerators, the ends of the magnets (in the direction of their length) are effectively infinitely distant from points therewithin, as the ends do not affect the field within the bore at central locations. As such, each cross-section in the plane perpendicular to the axis of the bore is identical to all others. Accordingly, the method described hereinbelow for cylindrical magnets may be applied in the design of such long magnets, considering one of the plane cross-sections therein.

Under-the-Table and Behind-the-Wall Magnet

Figure 1:
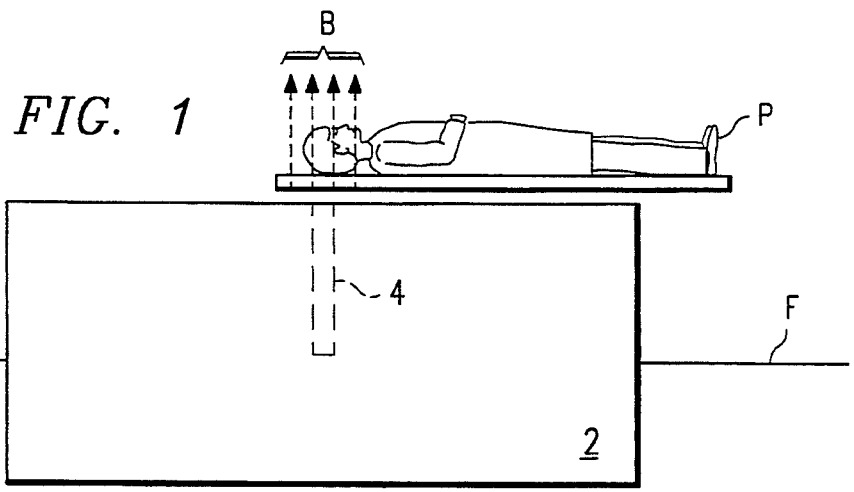
FIG. 1 is an elevation view of a magnet according to the first embodiment of the invention, oriented horizontally.

Referring first to FIG. 1, superconducting magnet 2 constructed according to a first preferred embodiment of the invention, and for providing a high DC magnetic field useful in NMR tomography and thus in MRI equipment, will first be described. According to this first embodiment of the invention, superconducting magnet 2 is partially disposed within floor F of the laboratory room, so as to extend above the level of floor F. The height of the top surface of magnet 2 is preferably on the order of one meter above the surface of floor F, i.e., approximately at table top height thereabove. While DC magnet 2 is illustrated in FIG. 1, gradient coils, RF coils, and detection coils are provided at or near the top surface of magnet 2 to provide the oscillating and gradient fields, and detection capability, necessary in NMR tomography. The enclosure of magnet 2 also roughly corresponds to the dimensions of the cryostat containing the superconducting coils for generating the field and any shielding that is desired, as will be described hereinbelow.

To perform an NMR tomography procedure, patient P is laterally moved over the center portion of magnet 2 until the organ of interest (in this case the head), overlies the location of bore 4 of magnet 2. The arrangement of the coils in magnet 2 described hereinbelow produces a highly uniform magnetic field B throughout a volume of interest ("VOI") above the plane of the surface of magnet 2. In this example, the VOI is a sphere of 20 cm diameter, having its center approximately 15 cm above the surface of magnet 2. The provision of a volume of interest outside of bore 4 of magnet 2 enables the imaging of an organ of patient P without requiring that patient P be inserted into a tunnel or other enclosure. As such, patient anxiety is much reduced while still providing adequate resolution over a reasonably sized VOI.

Figure 2:
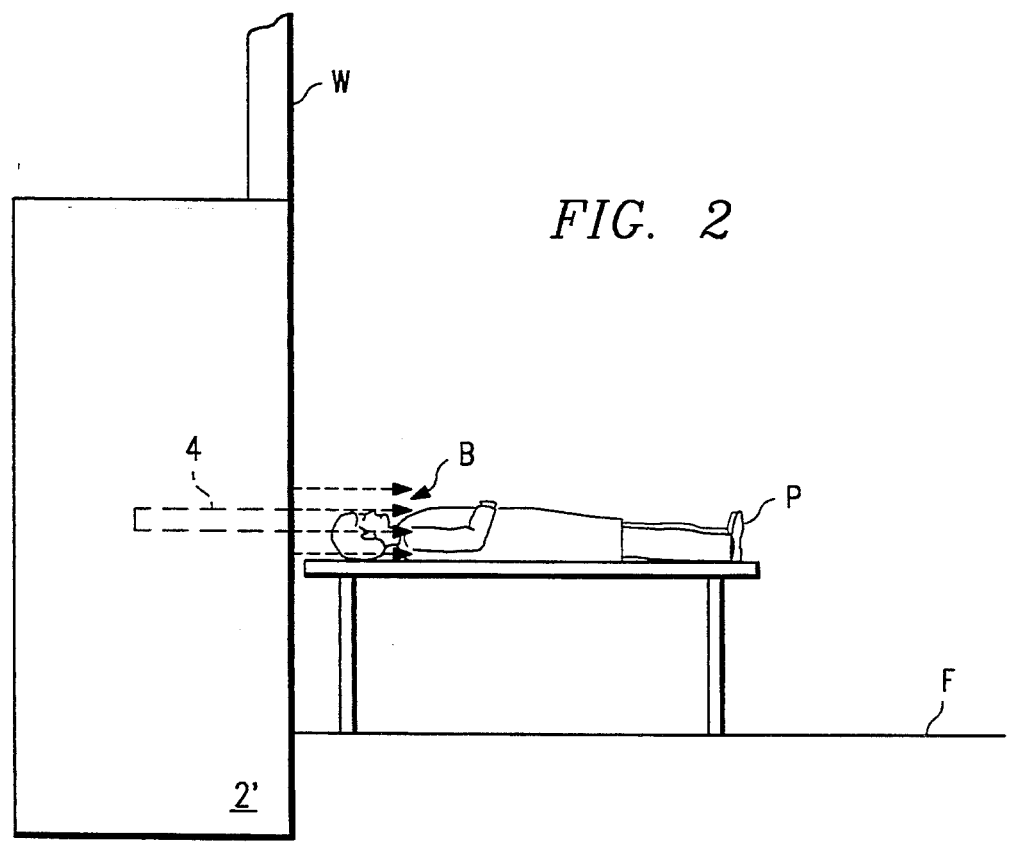
FIG. 2 is an elevation view of the magnet of FIG. 1, oriented vertically.

Referring to FIG. 2, an alternative implementation of magnet 2' is illustrated In this example, magnet 2' constructed similarly as magnet 2 of FIG. 1 and in the manner described hereinbelow, is oriented vertically so as to have its outer active surface substantially perpendicular to floor F, and flush with the surface of wall W. In this example, bore 4 is oriented horizontally, such that the coils inside of magnet 2 generate magnetic field B in a direction parallel to floor F, and substantially uniform over a VOI outside of magnet 2. Generated field B is preferably also approximately one meter above the surface of floor F, at table-top height, so that the selected organ of patient P (e.g., the brain, as shown in FIG. 2) may be readily imaged. In this example, patient P is placed on bed 6 which has a height corresponding to the position of bore 4. As in the case of magnet 2 of FIG. 1, generation of uniform field B in a volume of interest outside of bore 4 allows for NMR imaging of a patient's organs without insertion of the patient into a magnet bore, and thus enabling high resolution imaging with a greatly reduced sense of oppression from the viewpoint of the patient.

In each of FIGS. 1 and 2, it should be noted that magnet 2 is individually illustrated. It is of course to be understood that the remainder of the overall MRI system will be provided in combination with magnet 2, which provides the large DC magnetic field. For example, besides magnet 2, conventional MRI systems include gradient coils and RF coils for generating the gradient field within the VOI and the radio frequency magnetic field excitation, respectively, both necessary in conventional MRI. In addition, detecting coils will also be provided in which a current is induced from the response of gyromagnetic nuclei in the VOI to the magnetic fields applied thereto; a conventional computer control and image storage system will also be provided. The design of these particular additive elements will depend, of course, upon the particular MRI system design desired, although it is highly preferred that the gradient, RF and detecting coils be located under the table height of magnet 2 (FIG. 1) and behind wall W (FIG. 2). It is contemplated that one of ordinary skill in the art will be able to provide such additional features to magnets 2, 2' according to this embodiment of the invention, utilizing conventional technology. For example, conventional technology for the design of gradient coils is described in Pissanetzky, "Minimum energy MRI gradient coils of general geometry" *Meas. Sci. Technol.*, Vol. 3 (IOP Publishing Ltd., 1992), pp. 667–673.

Figure 3A:
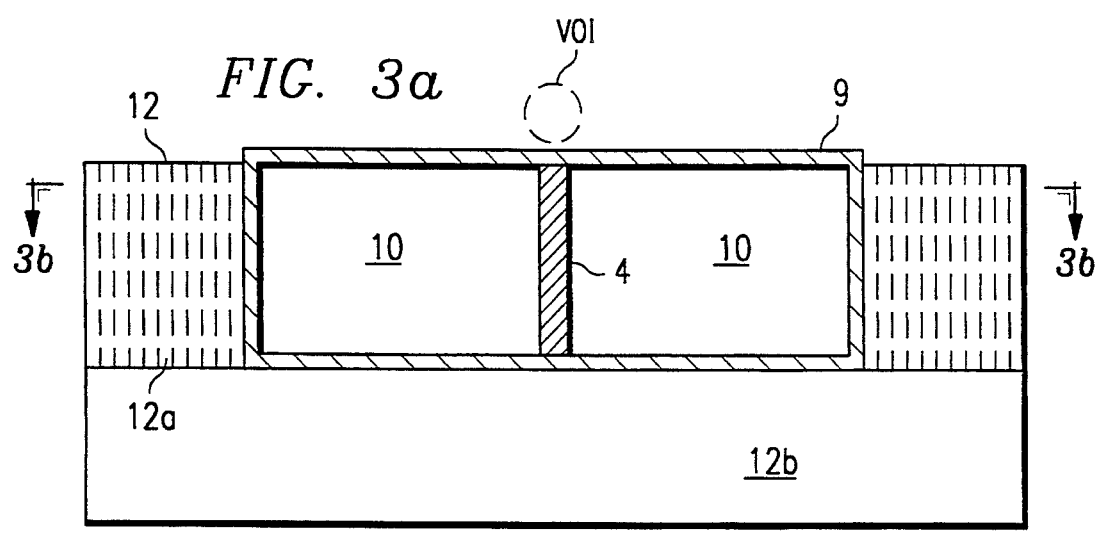
FIGS. 3a and 3b are cross-sectional elevation and plan views, respectively, of the magnet of FIG. 1, illustrating the position of the volume of interest relative to the coils and cryostat.
Figure 3B:
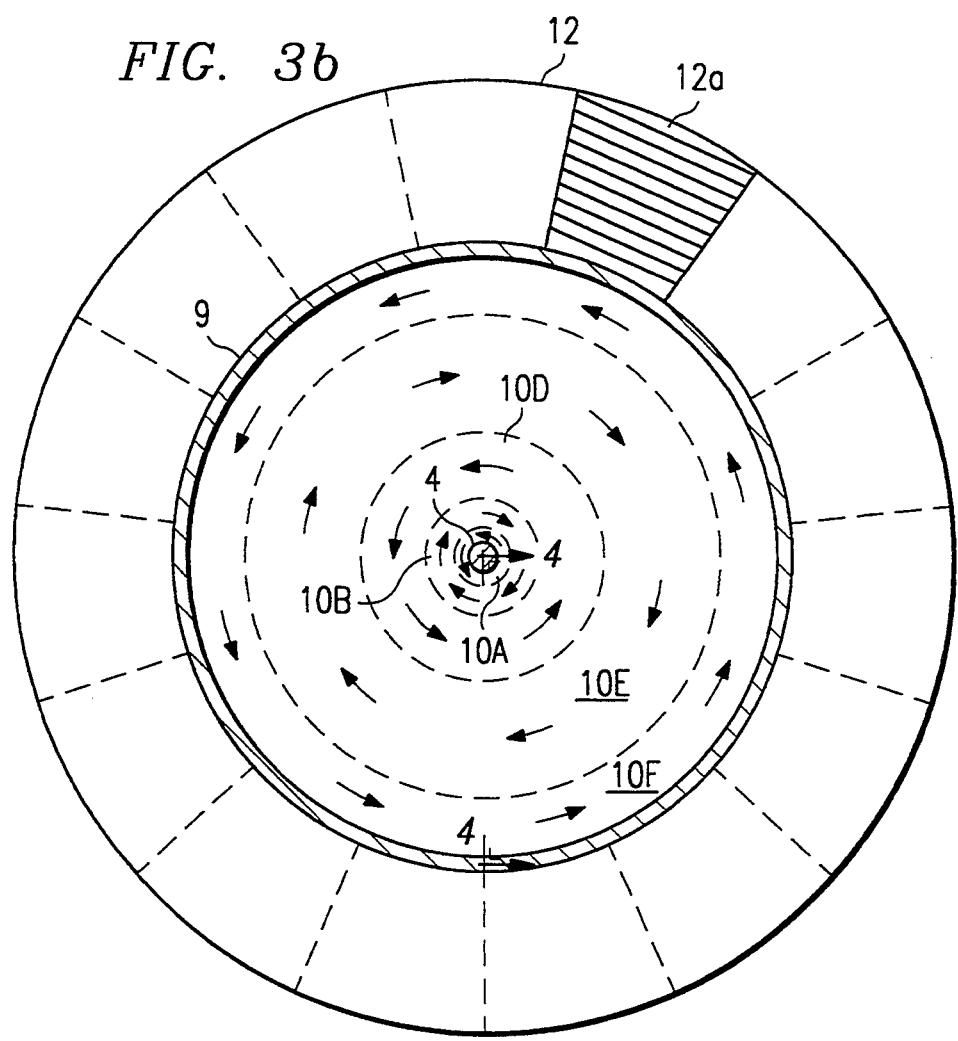

Referring now to FIGS. 3a and 3b, the construction of under-the-table magnet 2 of FIG. 1 will now be described. In this example, magnet 2 is capable of generating a suitably high DC magnetic field, such as on the order of 5 kgauss, with high uniformity (10 ppm or less deviation) over a spherical VOI of diameter on the order of 20 cm, and centered approximately 10 cm above the top surface of the coils of magnet 2.

FIG. 3a illustrates the construction of magnet 2 in a cross-sectional elevation view, while FIG. 3b illustrates magnet 2 in a cross-sectional plan view. According to this embodiment of the invention, magnet 2 includes coil assembly 10 disposed within cryostat 9. Coil assembly 10 includes multiple coils 10A through 10F, each having multiple turns of superconducting wire disposed within conventional bobbin structures about air bore 4, to generate a magnetic field in a direction parallel to the axis of bore 4. The arrangement of superconducting coils 10A through 10F, and the polarity and magnitude of current conducted thereby will be described in further detail hereinbelow.

Conventional superconducting wire may be used in coils 10A through 10F according to this embodiment of the invention. An example of such conventional superconducting wire is SCOK superconducting wire manufactured and sold by Outokumpu Copper (USA) Inc. of Glendale Heights, Ill. The SCOK wire consists of 1.05 mm (O.D.) 2.32:1 Cu/NbTi wire, having a rating of 570 A at 6 Tesla fields; the capacity of this wire thus exceeds the 500 A current rating of conventional persistent switches. The coils are insulated from one another in the conventional manner, and placed within conventional bobbins at the locations within cryostat, leaving sufficient space interstitially between the wires to allow for a substantial amount of copper stabilizer, mechanical banding, and grooves to allow the circulation of cryogenic fluid therethrough.

Cryostat 9 is a conventional non-magnetic stainless steel shell, such as 304 L stainless steel, of sufficient strength to allow for its interior to be pumped down to the desired vacuum when chilled to superconducting temperatures, and to provide the desired structural support for the bobbins within which the superconducting coils wire is placed and also the ducting of the cryogenic coolant. Conventional cryogenic compressor equipment (not shown) is connected to cryostat 9 by way of conventional ducting to cool the interior of cryostat 9 to superconducting temperatures. For example, where the superconducting wire is formed of a niobium titanium alloy, the upper limit on the superconducting temperature is 9.2° K. An example of a cryogenic unit capable of maintaining such temperature is model CGR511-4.5 manufactured and sold by CVI, Inc., which uses liquid helium as the coolant fluid.

Also according to this embodiment of the invention, iron shield 12 is disposed outside of coil assembly 10 and cryostat 9. Iron shield 12 provides shielding of the magnetic field in the conventional sense, thus reducing the fringe field from magnet 2. In addition, it is contemplated that iron shield 12 will also serve to enhance the magnetic field generated by magnet 2, as described in the above-referenced U.S. Pat. Nos. 4,783,628 and 4,822,772.

In order to minimize the cost of manufacturing, and particularly the tolerances to which iron shield 12 must be formed, it is preferred that iron shield 12 include a series of iron plates 12a disposed around coil assembly 10, with both iron plates 12a and coil assembly 10 overlying a lower iron shield unit 12b. As illustrated in FIG. 3b, plates 12a are preferably arranged adjacent to and parallel with one another in a direction parallel to the axis of bore 4, and in multiple segments around the circumference of the circular cross-section of coil assembly 10 (see FIG. 3b). Each plate 12a defines a chord in the circular cross-section of the magnet, and extends the height between the surface of magnet 2 and the top of lower iron shield portion 12b. The preferred material of plates 19 is 1008 steel, which is ferromagnetic as is well-known. The width of plates 12a increases with its radial distance from bore 4 to substantially fill the volume within the arc defined by its segment. In this example, fifteen segments of iron plates 12a surround bore 4 and coil assembly 10.

Lower iron shield portion 12b, underlying coil assembly 10 and plates 12a, may either be formed of a single slab of iron or, alternatively, of a plurality of iron plates of circular cross-section oriented so that the axis of bore 4 is normal thereto.

In the alternative to provision of cryostat 9 within iron shield 12, the cryostat volume may also include iron shield 12. While the cryogenic load will be substantially increased for this alternative construction, the closer proximity of iron shield 12 to coil assembly 10 can result in improved shielding.

Magnet 2 constructed according to this embodiment of the invention can be constructed for a 20 cm diameter VOI without requiring a huge volume for its implementation. In an example of magnet 2 contemplated to be fabricated according to this embodiment of the invention, the overall diameter of magnet 2 (including iron shield 12) is on the order of 370 cm; the height of magnet 2, measured from the bottom of lower iron shield 12b to the top edges of iron shield plates 12a (and the top surface of coil assembly 10), is on the order of 140 cm. The radial thickness of each segment of iron shield plates 12a, when assembled, is on the order of 60 cm, and the thickness of lower iron shield portion is also on the order of 60 cm. The diameter of bore 4 in this example is approximately 4 cm, and the radius of coil assembly 10 (measured from the axis of bore 4 to its outer circumference) is on the order of 185 cm. The thickness of coil assembly 10 is on the order of 80 cm.

FIG. 3b illustrates that coil assembly 10 includes coils 10A, 10B, 10C, 10D, 10E and 10F, having varying total current magnitudes and polarity relative to one another. The arrows illustrated in FIG. 3b indicate the direction of current therewithin corresponding to magnetic field B having an orientation coming out of the page. Similarly as in the magnet described in said copending application Ser. No. 869,544, filed Apr. 15, 1992 in the name of Sergio Pissanetzky, and entitled "An Ultrashort Cylindrical Shielded Electromagnet For Magnetic Resonance Imaging", commonly assigned herewith, incorporated hereinabove by reference, and the parent of this continuation-in-part application, the cross-sectional size, location, current magnitude and current polarity in each of coils 10A, 10B, 10C, 10D, 10E and 10F is preferably determined according to the "structured coils" methodology, as described in Pissanetzky, "Structured coils for NMR applications" *IEEE Trans. Magnetics*, Vol. 28, No. 4 (IEEE, July 1992), pp. 1961–1968, and Pissanetzky, "Structured Coils and Nonlinear Iron", presented at the 5th Biennial IEEE Conference on Electromagnet Field Computation, Claremont, Calif. (Aug. 3–5, 1992), both incorporated herein by this reference.

As noted above, conventional design methodology assumes a uniform current density in the cross-section of the coil, and adjusts the coil geometry to reduce undesired field harmonics. In contrast, the structured coils methodology allows the current density within the coil assembly to vary as a function of location, i.e., as a function of both axial and radial distance from the target sphere. This fundamental difference in approach enables the design of magnets for a VOI that is not necessarily centered in the magnet bore, and in a manner that readily comprehends minimization of fringe field and the effects of iron shielding.

According to the present invention, modeling of the magnet construction defines current density in a piecewise constant manner, with the coils divided into small sections of equal rectangular cross-section (i.e., the coil elements), each having its own current magnitude. The desired field magnitude and direction at target locations within the VOI are selected; field direction and magnitude at target locations in the space surrounding magnet 2 may also be selected to allow the optimization process to consider minimization of the fringe field outside of magnet 2 in setting the coil currents. With the field magnitude at the target locations defined, the coil element currents then become the unknowns of a problem where the fields at the target locations are known, and in which certain constraints in the current density within the coil elements are preset, considering the current capacity of the superconducting material and other physical limitations. In the typical case, the current density constraints in the coil elements define a simplex in the multi-dimensional space of unknown currents, allowing the currents to be solved by way of the well-known Simplex method of mathematical quadratic programming. The operation of the structured coils methodology is thus suitable to be performed on a conventional digital computer, for example a SPARC-STATION workstation manufactured and sold by Sun Microsystems, Inc.

It has been found that the structured coils methodology is particularly useful in that it allows for most currents in the coil elements to be set at their upper or lower bound. In magnet 2 according to this embodiment of the invention, which allows currents of varying polarity within coil assembly 10, the lower bound is a negative current density value. Furthermore, it has been found that the structured coils approach causes "clustering" of like current magnitudes, which is advantageous as it provides for the physical construction of the coils as sets of coils, of irregular shape but with a constant current density therein, as in the case of magnet 2. The optimization process causes most, if not all, of the currents to attain their upper or lower bounds. Furthermore, the "clustering" of like currents results in a coil cross-section being divided into a few compact, consolidated regions of irregular shapes, i.e. a "structured"

coil. Such a structured coil can readily be constructed from a few sections of uniform winding, because the current density is uniform within each consolidated region.

As described in the Pissanetzky IEEE article incorporated herein by reference, it is preferable to utilize the structured coils methodology by using an "approaching target" strategy, where a target value is selected for each target location, and where the difference between actual field and the target field value is minimized by way of constrained quadratic optimization of the error form. This minimization is facilitated in the cylindrical coils such as in magnet 2 of the present invention, where the number of coil elements is much larger than the number of target locations. As noted above, maximum and minimum current density limits are set for each coil element, defining a non-empty simplex. Simplex minimization of the quadratic error form is then performed, such as by way of the readily available computer software described in Reports AERE-R 9185, TP 401, R 6370 and TP 528, in the Harwell Subroutine Library, Computer Science and Systems Division, Atomic Energy Research Establishment, Harwell, Oxfordshire, England (1984), incorporated herein by this reference. This minimization continues until the current density constraints that prevent further reduction are identified; these constraints are adjusted, and the minimization performed again.

Figure 20:
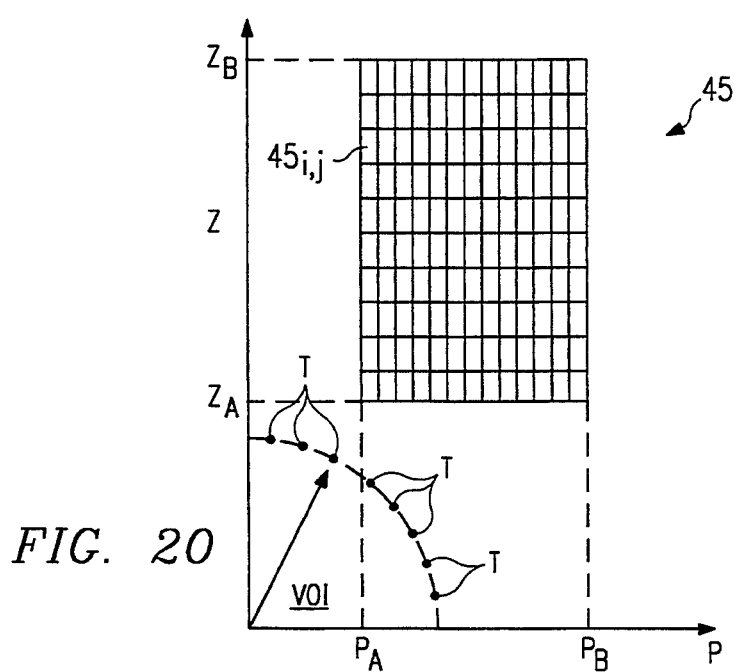
FIG. 20 is a schematic cross-section of a superconducting coil designed according to the methodology of FIGS. 19a and 19b.
Figures 19A, 19B:
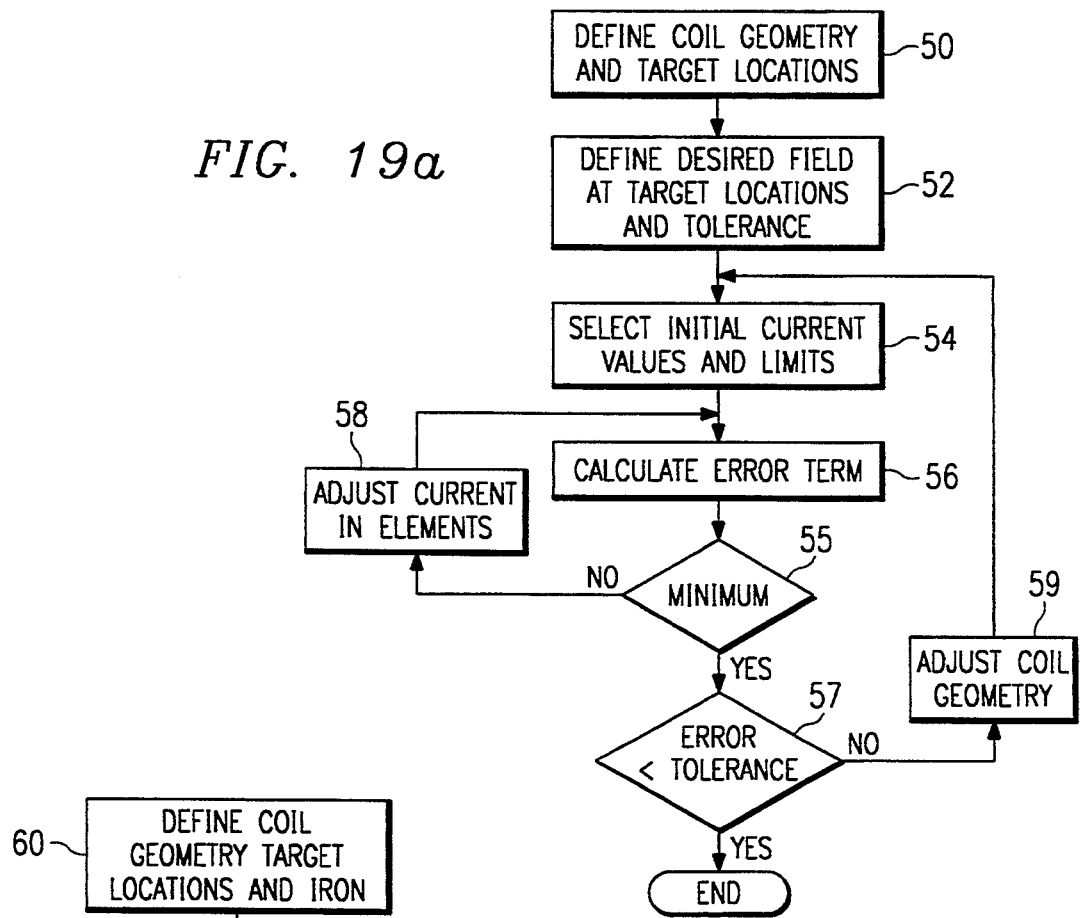
FIGS. 19a and 19b are flow charts illustrating a methodology for magnet design according to the preferred embodiment of the invention.

FIG. 19a illustrates a flow chart of the methodology for designing magnet 2 according to the preferred embodiment of the invention, relative to an exemplary coil 45 illustrated in quarter cross-section in FIG. 20 and having multiple coil elements $45_j$ therein. As noted above, this methodology may be performed on a conventional digital computer, such as a SPARCSTATION workstation.

In step 50, the coil geometry and target locations are defined in this example, in the z-$\rho$ plane. As noted above, the methodology according to this embodiment of the invention is applicable to magnets of varying symmetry. Magnet 2 useful in MRI systems is of the cylindrical type, and as such the coil elements $45_j$ correspond to solid solenoid loops about bore 24. This method may also be applied to a long magnet, such as the type used in particle accelerators, where the effect of the ends of the magnet on the field in the VOI are insignificant; in this case, the cross-section of the magnet illustrated in FIG. 20 is identical to that for a cylindrical magnet, but the coil elements $45_j$ will correspond to infinitely long bars, or wires, extending into and out of the page of FIG. 20. The symmetry of the magnet is thus also defined in process 50 of FIG. 19a, as the field calculations will differ for magnets of different symmetry.

In the example shown in FIG. 20, the VOI has its center at the origin of the z-$\rho$ plane, and is of radius r. Target locations T may be defined at the surface of the VOI, at the distance r from the origin; since the magnetic field is a harmonic function in the VOI, the magnetic field is guaranteed to be at least as uniform within the interior of the VOI as at its perimeter. The location of coil 45 is defined relative to the VOI at minimum and maximum z and $\rho$ locations. In the example of FIG. 20, where coil 45 is rectangular, coil elements $45_j$ are arranged in an rectangular array within the rectangle defined by the $z_A$, $Z_B$, $\rho_A$, $\rho_B$ limits of coil 45. The size of individual coil elements $45_j$ and their arrangement within coil 45 are also defined in step 50. In addition, as discussed hereinabove, it is preferable that the number j of coil elements $45_j$ be much greater than the number of target locations T, so that a sizable number of degrees of freedom is provided for the solution of the non-empty simplex defined by the dimensional, current and field constraints.

In step 52, the nominal desired field magnitude at the target locations T is defined, along with the acceptable range from the nominal magnitude. As will be described hereinbelow, for the case of actively shielded magnets, target locations outside of the magnet (i.e., $z > z_B$ and $\rho > \rho_B$) may also be defined, at which the stray field is to be reduced to below a maximum value. In step 54, the range of current density for each of coil elements $45_j$ is set. The lower current density limit is preferably a negative value, so that coils carrying current of opposite polarity may be used to optimize the field; alternatively, with a lower current density limit of zero, coil elements $45_j$ will either carry current of the same polarity or no current. These current density limits are preferably selected according to physical constraints, such as the critical current considerations for superconducting coils, or from the cooling requirements for non-superconducting coils. Also in step 54, an initial value of the current density for each of coil elements $45_j$ is established.

In step 56, an error term is calculated for each of the target locations T, by calculating a weighted sum of the difference between the field produced thereat by the initial value of current density and the desired nominal value for each of coil elements $45_j$. This error term corresponds to:

$$Z = \sum_{i=1}^{n} W_i (B_{zi} - B_0)^2$$

where $W_i$ is the weighting factor for target location $T_i$, where $B_{zp}$ is the field at one of target locations T, where n is the number of target locations T, and where $B_0$ is the desired field magnitude at the target location. Each field value $B_{zp}$ is preferably calculated as a linear combination of the current carried by each coil element $45_j$ assuming it is a solid solenoid (for cylindrical magnet 2), in the manner described in Urankar, "Vector potential and magnetic field of current carrying finite arc segment in analytical form part III: exact computation for rectangular cross section" *IEEE Trans. Magnetics*, Vol. MAG-18 (IEEE, 1982), pp. 1860–67, incorporated herein by reference.

Decision 55 determines if the error term is at a global minimum, by determining if a point in the simplex exists which has a smaller value for the error term. This test, in effect, determines if any adjustment in the current value is available which would further reduce the error term Z. If such an adjustment is available, i.e. if the error term is not at its global minimum, process 58 is performed by which the current in the coil elements is adjusted, and the calculation of the error term again performed. Such adjustment of the current density, and thus the minimization of the error term, may be performed according to conventional quadratic programming.

Upon the error term reaching its global minimum (the result of decision 55 is positive), decision 57 is performed by which the value of the error in the field at target locations T (the global minimum for error term Z) is compared against the tolerance limit set in process 52. If the minimum of the error exceeds the tolerance limit, the geometry defined in process 50 cannot meet the desired field uniformity requirements. Accordingly, the size of coil 45 is then adjusted in process 59, generally by making coil 45 larger, and the method repeated from process 54 for the new coil geometry. The process continues until the minimum of the error term decreases to meet the tolerance limit, upon which the design is complete (process 59), as the desired magnetic field magnitude and uniformity has been reached, and the size, shape and location of the clustered coils and their current values is determined. It should be noted that this iterative adjustment of the coil geometry in process 59 optimizes the size of coil 45 for a given tolerance limit.

As noted hereinabove, the method according to this embodiment of the invention generally results in "clustering" of coil elements $45_j$ having the same current density, usually at one of the limits, thus facilitating construction of superconducting (or non-superconducting, as the case may be) coils. Upon determining the current density, size, shape and location of individual coils, construction of a magnet according thereto may be accomplished in the conventional fashion.

In the alternative to minimization of the error term of the calculated field relative to the desired nominal field, the minimization routine may instead express the zonal coefficients of the field in the VOI as linear combinations of that produced by the current conducted by coil elements $45_j$, for example according to the computer-ready expressions in Garrett and Pissanetzky, "Polygonal coil systems for magnetic fields with homogeneity of the fourth to eighth order", Rev. Sc. Instr., Vol. 42 (1971), pp. 840–857, incorporated herein by this reference. Minimization of these zonal harmonic coefficients subject to the current density limits will also result in a structured coil design. Clustering will also generally occur according to this minimization of zonal harmonic coefficients.

In addition, iron shielding may be considered in the design of the coils according to the method described hereinbelow, even though iron presents significant non-linear effects to the magnetic field. For example, magnet 2 of FIG. 3 includes iron flux return 12. Consideration of the effects of iron flux return may be made by first optimizing coil shapes for a bore field strength without the iron flux return, and then adding the field enhancement expected from the use of iron in the magnetic loop. An alternative method for considering the effects of iron is illustrated in FIG. 19b.

Process 60 in this method of FIG. 19b defines the coil geometry and target locations, and process 62 defines the desired field at target locations T and the tolerance limit, as in the prior case. In this alternative method, however, process 64 is initially performed by way of which the magnetization M due to the iron flux return is initialized to zero. Process 66 is then performed, in similar manner as processes 56, 58 and decision 55 of FIG. 19a, to optimize the current density in the coil elements. In the calculation of process 66, however, the magnetic field due to the iron ($B_{Fe}$) is added to that produced by the current ($B_j$), prior to its comparison to the nominal desired field $B_o$. After this optimization according to quadratic programming techniques, finite element modeling is used to calculate a new magnetization M in the iron (process 68), for example by way of conventional finite element methods (e.g., the well-known OPUS computer program). Decision 65 is then performed by which the convergence condition is checked; if convergence (either of the error term, or of magnetization M) is not present, process 67 is performed in which a new field $B_{Fe}$ is calculated based on the new magnetization M in the iron, and the error term minimization of process 66 performed again. Upon completion (the result of decision 65 being positive), the magnetic field is optimized in the VOI, and the size, shape, location and current carried by the coil elements defined; clustering continues to occur for iron shielded magnets, as well as in the case of non-shielded magnets.

The magnetization M, or field enhancement factor, thus allows optimization of the currents in the defined coil shapes for field uniformity in the VOI. The result is successful so long as the current adjustments are not so significant that the coil shape optimization is defeated. The design of coil currents described hereinbelow contemplates the presence of iron shield 12, and was accomplished by this method.

Figure 4:
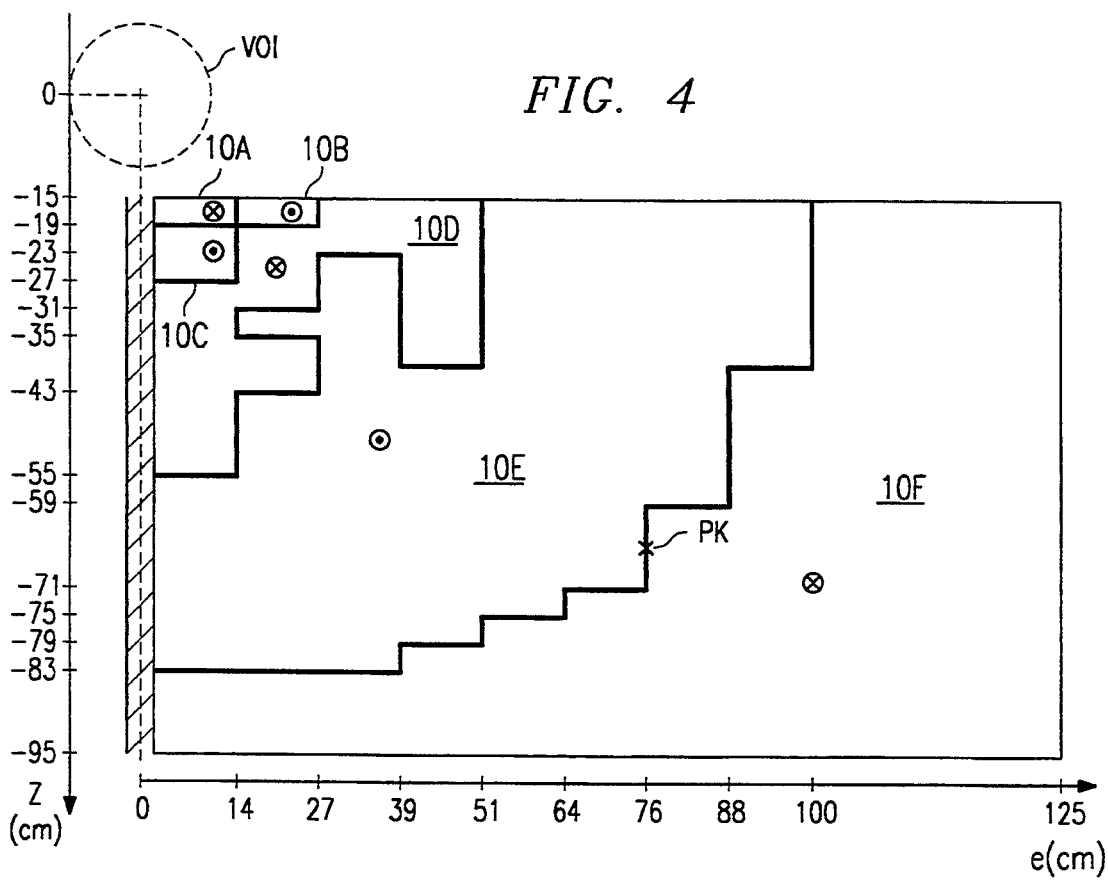
FIG. 4 is a cross-sectional schematic diagram of the coils in the magnet of FIG. 1, presented in an elevation view.

Referring now to FIG. 4, the shape and current of coils 10A through 10F in this example of magnet 2 according to this embodiment of invention will now be described, as optimized for a spherical VOI of 20 cm diameter located outside of bore 4 in combination with a low fringe field outside of iron shield 12. FIG. 4 illustrates the right-hand half of the elevation cross-section of coil assembly 10 shown in FIG. 3, as indicated by the presence of bore 4. The z-axis dimensions in FIG. 4 are measured from the center of the VOI (i.e., from 15 cm above the top surface of coil assembly 10), and the $\rho$-axis dimensions are measured from the axis of bore 4 (i.e., 2 cm to the left of the left-hand edge of the right-hand half of coil assembly shown in FIG. 4).

The arrangement of the coils 10A through 10F in FIG. 4 resulted from optimization of the field uniformity within the VOI. The polarity of current flow within each of coils 10A through 10F is indicated by a cross-within-circle for current into the page (coils 10A, 10D, and 10F) and by a dot-within-circle for current out of the page (coils 10B, 10C, 10E), for generating a magnetic field in the +z direction (upward in FIG. 4, as in FIG. 1). To generate a 5 kgauss field within the VOI, the total current (current density times cross-sectional area of the coil) within each of coils 10A through 10F in this example are as follows:

| Coil | Current (kA) |
| --- | --- |
| 10A | 26.63 |
| 10B | −37.95 |
| 10C | −118.75 |
| 10D | 1544.62 |
| 10E | −7377.01 |
| 10F | 7357.70 |

In this arrangement, simulation of the field magnitude, performed by way of finite element simulation of the field according to the OPUS computer program, available from Ferrari Associates, Inc. of Jacksonville, Fla., indicated that the peak field within magnet 2 was approximately 70 kgauss at location PK between coils 10E, 10F. The total currents noted above are obtained for a substantially constant current density for each of coils 10A through 10F (both within each coil 10A through 10F, and also among the separate coils 10A through 10F relative to one another) of approximately 1700 A/cm$^2$; as such, conventional superconducting wire as noted above will be capable of generating the 5 kgauss field within the VOI, of 10 ppm uniformity or better, while still leaving adequate space within coil assembly 10 for copper stabilizers, grooves for conducting cryogenic fluid, and metal banding for providing mechanical strength.

Figure 5:
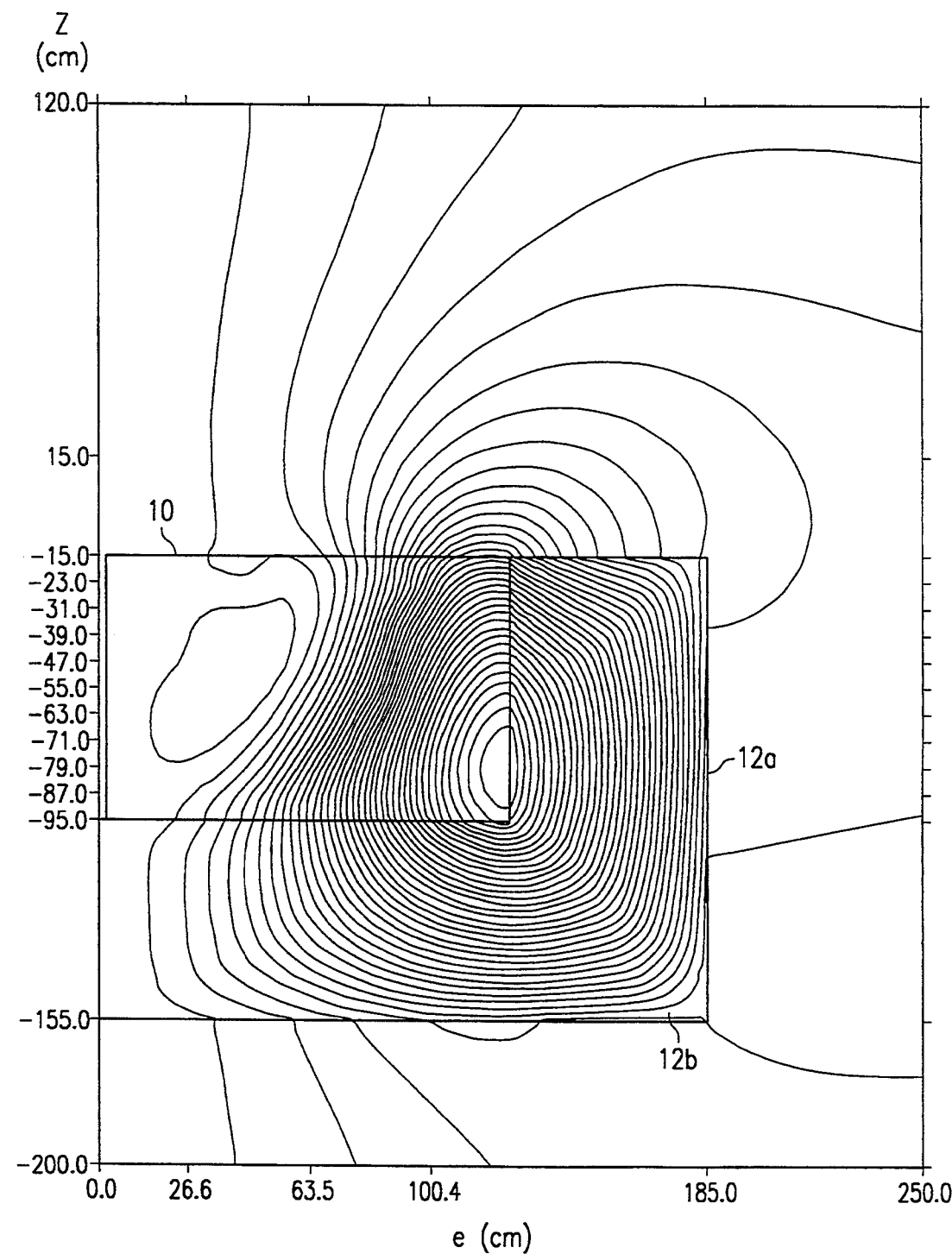
FIG. 5 is a field line diagram of the homogenous and fringe field produced by the magnet of FIG. 1.

FIG. 5 illustrates the field lines resulting from this arrangement of coils 10A through 10F, and the above-specified currents, as modeled by way of the OPUS computer program. For purposes of simplicity of presentation (and of simulation), the field lines of FIG. 5 are illustrated for the half-cross-section of FIG. 4; the axial symmetry of magnet 2 according to this embodiment of the invention allow this representation to accurately convey the field behavior around the full circle of magnet 2. As indicated in FIG. 5, the bulk of the flux generated by coil assembly 10 returns through the portion of the magnetic circuit comprised of iron shield plates 12a and lower iron shield 12b, with only minimal fringe field outside of iron shield 12. The OPUS simulation of this magnet arrangement indicates that the 5 gauss line is located only 9.2 meters in front of magnet 2 (i.e., on the same side of coil assembly 10 as the VOI, at $z = +920$ cm), and only 2.0 meters away from the outer diameter of iron shield 12. Such a low stray field is believed to be quite good for a magnet in which the VOI is outside of the bore.

In this modeled example, the total weight of iron shield is approximately 85 tons; by increasing the size of iron shield, the 5 gauss line may be brought even closer than in the case discussed above. Magnet 2, according to this modeled example, provides the above performance with approximately 67,000 kA-meters of superconductor, which is quite efficient. The modeled magnetic energy in the magnet is approximately 24.9 MJoule.

As a result of the construction of magnets 2, 2' according to this embodiment of the invention, it is contemplated that NMR tomography is enabled for human organs in a volume of interest outside of the magnet bore. As a result, the patient does not have to be placed into a tunnel or other cylinder, but instead need only be placed over a table top (as in FIG. 1) or adjacent a laboratory wall (as in FIG. 2). Full access to the patient by medical personnel during the MRI procedure is thus provided by this embodiment of the invention, and the degree of patient anxiety is much reduced over prior art magnets. Furthermore, the fringe field of magnet 2 is acceptable according to this construction, and the size and weight of magnet 2, including an iron shield, is reasonable for laboratory size MRI equipment.

Bagel-shaped Magnet for MRI Of Human Organs

Figure 6:
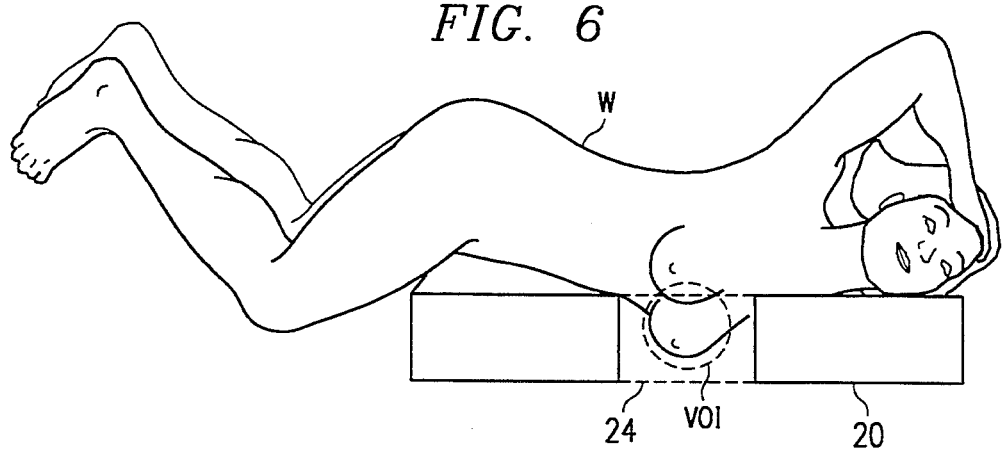
FIG. 6 is an elevation cross-sectional view of a magnet according to a second embodiment of the invention.

Referring now to FIG. 6, magnet 20 according to a second embodiment of the invention will now be described in detail. As is well known in the art, the NMR tomography of externalities of a human patient, including the arm, leg and head, is often necessary for the diagnosis of various physical ailments. A particularly important application of NMR tomography is the imaging of the female breast in periodic screening for cancerous tumors. The NMR tomography of such externalities is conventionally performed in the same whole body "tunnel" or cylindrical MRI systems in order to generate a sufficiently high DC magnetic field of adequate uniformity for imaging; these magnets are accompanied by the significant disadvantages of high patient anxiety and limited access by medical personnel described hereinabove. This second preferred embodiment of the invention provides a magnet 20 which takes advantage of the limited volume of interest (VOI) required for such imaging and the external nature of the organ or appendage being imaged, to provide a high DC magnetic field that is highly uniform over a limited VOI, without requiring insertion of the whole body of the patient thereinto, as required in conventional cylindrical magnets.

As illustrated in FIG. 6 for the example of breast MRI, magnet 20 according to this embodiment of the invention is a relatively small (on the order of 1.1 meter outside diameter) magnet of annular shape, having cylindrical bore 24 in its center of on the order of 20 cm in diameter. The field strength of magnet 20 is contemplated to be on the order of 10 kgauss (1.0 Tesla), substantially uniform ($<10$ ppm) over the VOI of on the order of 10 cm in diameter. This shape and construction of magnet 20 allows for patient W to remain outside of the bore of magnet 20 while still enabling the imaged breast to be disposed within the VOI. As suggested in FIG. 6, the VOI is not centered within bore 24 of magnet 20, but instead is vertically offset to facilitate imaging of the breast of patient W without requiring whole body insertion into a magnet bore as required by conventional cylindrical MRI systems.

The overall thickness of magnet 20 is contemplated to be on the order of 15 cm, and its overall weight is contemplated to be on the order of 1000 pounds. As such, the construction of magnet 20 according to this embodiment of the invention provides a substantially portable magnet, such that the MRI system into which magnet 20 is implemented will have portability, allowing for its deployment by way of mobile vehicle (such as a mobile MRI screening truck), ship, spacecraft, and the like.

Alternatively, magnet 20 is suitable for the imaging of other externalities, such as arms, legs and the head, which may be inserted in bore 24 without requiring insertion of the whole body of the patient thereinto. For the imaging of such other externalities, the VOI need not be offset but may be centered relative to the midplane (the diameter of magnet 20); of course, the VOI may remain offset as illustrated in FIG. 6 and will still be useful for the imaging of such other externalities.

As discussed above relative to magnet 2, it is of course to be understood that the remainder of the overall MRI system will be provided in combination with magnet 20, as magnet 20 is intended to provide the large DC magnetic field necessary in NMR tomography. As such, the gradient and RF coils for generating the gradient and oscillating fields, respectively, within the VOI, as well as detecting coils for detecting the response of gyromagnetic nuclei in the VOI to the magnetic fields applied thereto, are contemplated to be provided in combination with magnet 20 to complete the MRI apparatus. As is well known in the art, the volume required for these additional coils is relatively small, and as such the representation presented in FIG. 6 is contemplated to be substantially accurate in illustrating the relative position of patient W to magnet 20, and thus to the VOI. The design of these particular additive elements will depend, of course, upon the particular MRI system design desired, and it is contemplated that one of ordinary skill in the art will be able to provide such additional features to magnet 20, according to this embodiment of the invention, by utilizing conventional technology. The Pissanetzky *Meas. Sci. Technol.* article incorporated by reference hereinabove is indicative of such conventional technology, in the field of gradient coil design.

Figure 7:
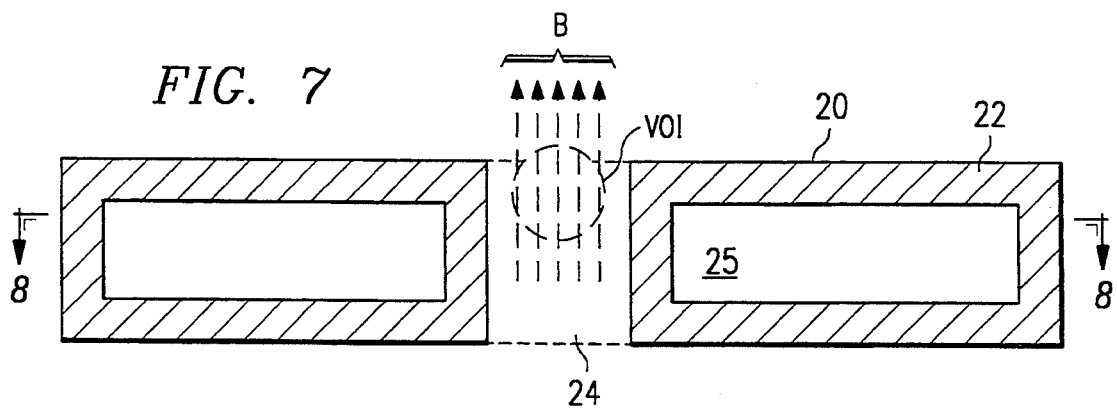
FIG. 7 is a cross-sectional elevation view of the magnet of FIG. 6.
Figure 8:
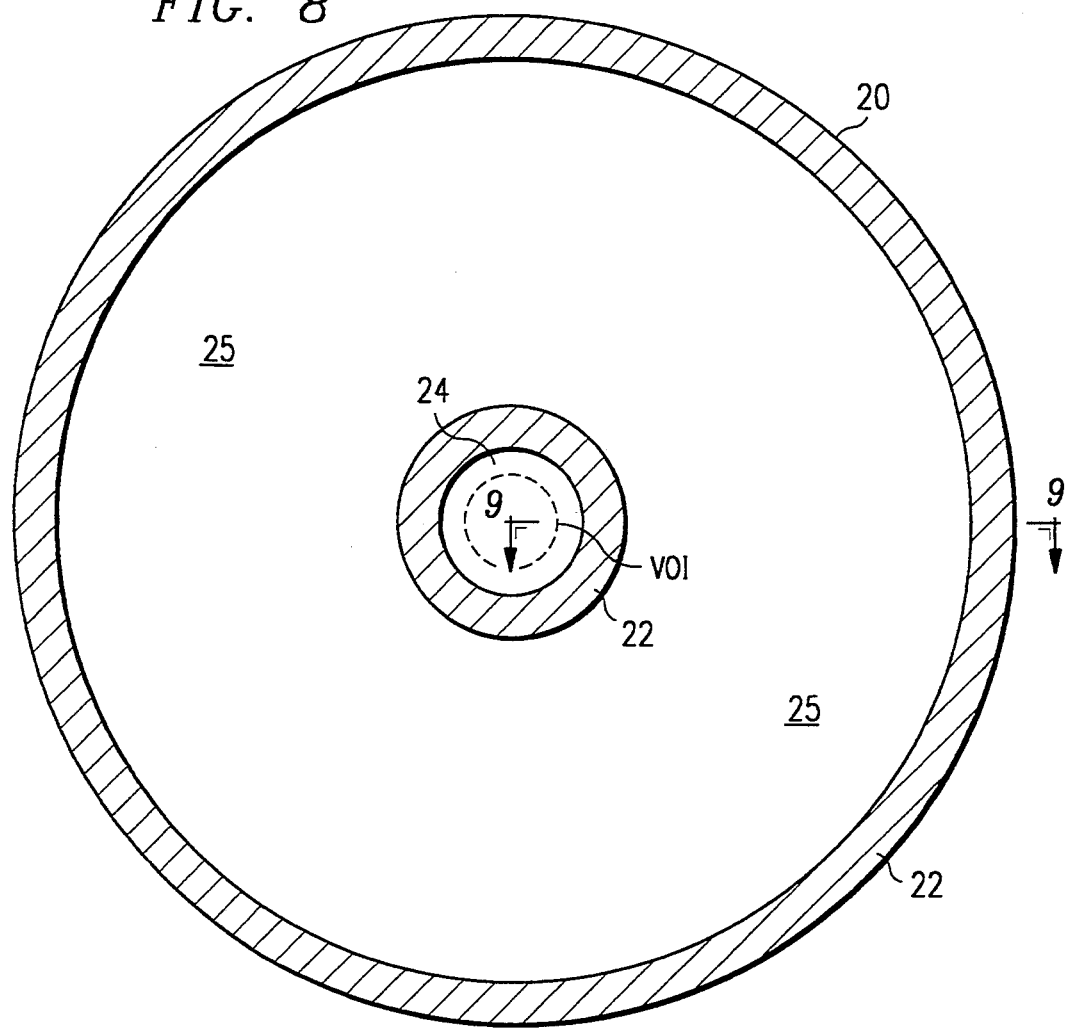
FIG. 8 is a cross-sectional plan view of the magnet of FIG. 6.

Referring now to FIGS. 7 and 8, the construction of magnet 20 will now be described in further detail. As shown in FIGS. 7 and 8, magnet 20 is preferably of the superconducting type, and as such includes coil assembly 25 disposed within cryostat 22. The orientation of the conduction of current in magnet 20 is in a circular direction about the axis of bore 24. In this example, the net current is counter-clockwise (relative to FIG. 8), and as such the orientation of magnetic field B is upward as shown in FIG. 7.

Cryostat 22 is of conventional construction, such as 304 L stainless steel, of sufficient strength to allow for its interior to be pumped down to the desired vacuum when chilled to superconducting temperatures, and to provide the desired structural support for the bobbins within which the superconducting coils wire is placed and also the ducting of the cryogenic coolant. Conventional cryogenic compressor equipment (not shown) is connected to cryostat 22 by way of conventional ducting, to maintain its interior at superconducting temperatures, as discussed above relative to magnet 2. In addition, the superconducting wire in coil assembly 25 of magnet 20 is contemplated to be of the conventional niobium titanium alloy type, such as the rectangular cross-section Rutherford type cable discussed above, consisting of braided SCOK superconducting wire with kapton insulation. As such, the temperature at which cryostat 22 must maintain coil assembly 25 is on the order of 4.2° K.

Alternatively, it is contemplated that conventional wire conductors (i.e., non-superconducting) may be utilized within magnet 20, resulting in a very inexpensive system amenable for widespread use. Of course, the current capacity of non-superconducting wire is substantially limited relative to that of superconducting wire, which will likely limit the field strength available for magnet 20. As such, it is preferred that magnet 20 be of the superconducting type.

Figure 9:
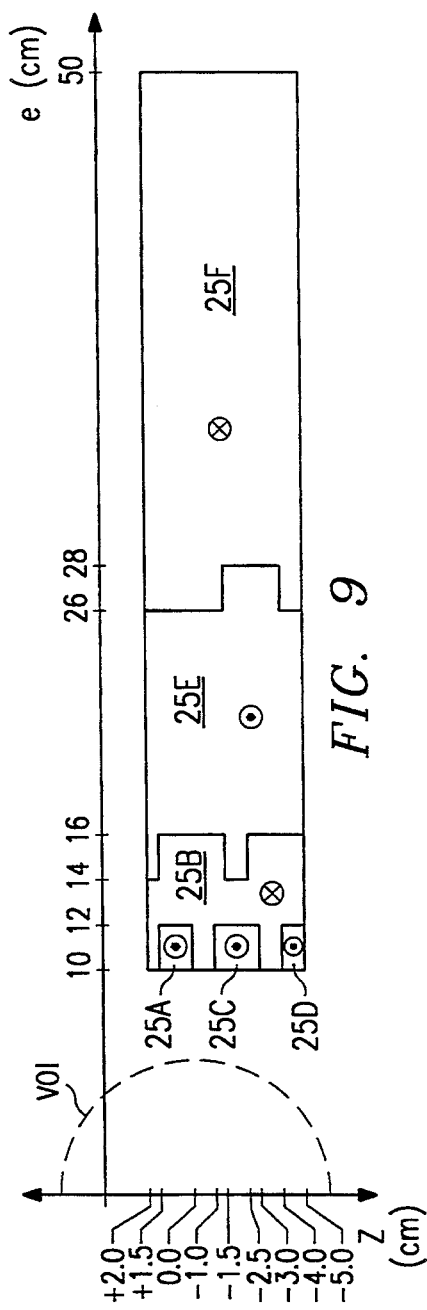
FIG. 9 is a cross-sectional schematic diagram of the coils in the magnet of FIG. 6, according to an unshielded version thereof.

Referring now to FIG. 9, the arrangement of coils 25A through 25F within coil assembly 25 will be described in detail relative to an unshielded version of magnet 20. As described hereinabove relative to magnets 2, 2' coil assembly 25 includes a plurality of coils 25A through 25F, each of which presents a different value of total current in magnet 20, and of varying polarity, with the goal of providing a highly uniform magnetic field B within the VOI. The illustration of FIG. 9 is for the right-hand half of magnet 20 as shown in FIG. 7; of course, the construction is symmetric about the axis of bore 24, and as such FIG. 9 is representative of the overall construction of coil assembly 25 in magnet 20.

The design of coils 25A through 25F is preferably accomplished by way of the structured coils methodology discussed above, in which the current polarity and magnitude for discrete positional elements of coil assembly 25 (in the z-ρ plane as shown in FIG. 9) are adjusted relative to maximizing the uniformity of field in the VOI at the desired magnitude. As noted above, the structured coils methodology often happily results in coil elements carrying their maximum or minimum current density, with those of like polarity tending to "cluster" together, but where the shapes of clustered coil elements are somewhat irregular such that the shape and size of the coils 10A through 10F determines the total current therethrough.

For the example of a 10 kgauss field in the VOI generated by magnet 20 having the dimensions described hereinabove, and where the VOI is offset from the midplane (z=0) axis by 2 cm, coils 25A through 25F having the shape noted in FIG. 9 resulted from optimization according to the structured coils methodology. The polarity of current flow within each of coils 25A through 25F is indicated by a cross-within-circle for current into the page (coils 25B and 25F) and by a dot-within-circle for current out of the page (coils 25A, 25C, 25D, 25E), for generating a magnetic field in the z direction (upward in FIG. 9, as in FIG. 7). The current density magnitude in each of coils 25A through 25F resulting from this methodology is approximately 8.0 kA/cm$^2$, which in the case of niobium-titanium alloy superconducting wire, allows for a great deal of room for copper stabilizer, cryogenic coolant conduction grooves, structural steel banding, and conventional quench protection elements. As noted above, this current density is substantially constant across each of coils 25A through 25F. To generate a 10 kgauss field within the VOI, the total current (current density times cross-sectional area of the coil) within each of coils 25A through 25F in this example are as follows:

| Coil | Current (kA) |
| --- | --- |
| 25A | −24.00 |
| 25B | 223.42 |
| 25C | −28.35 |
| 25D | −13.17 |
| 25E | −618.46 |
| 25F | 1304.00 |

Figure 10:
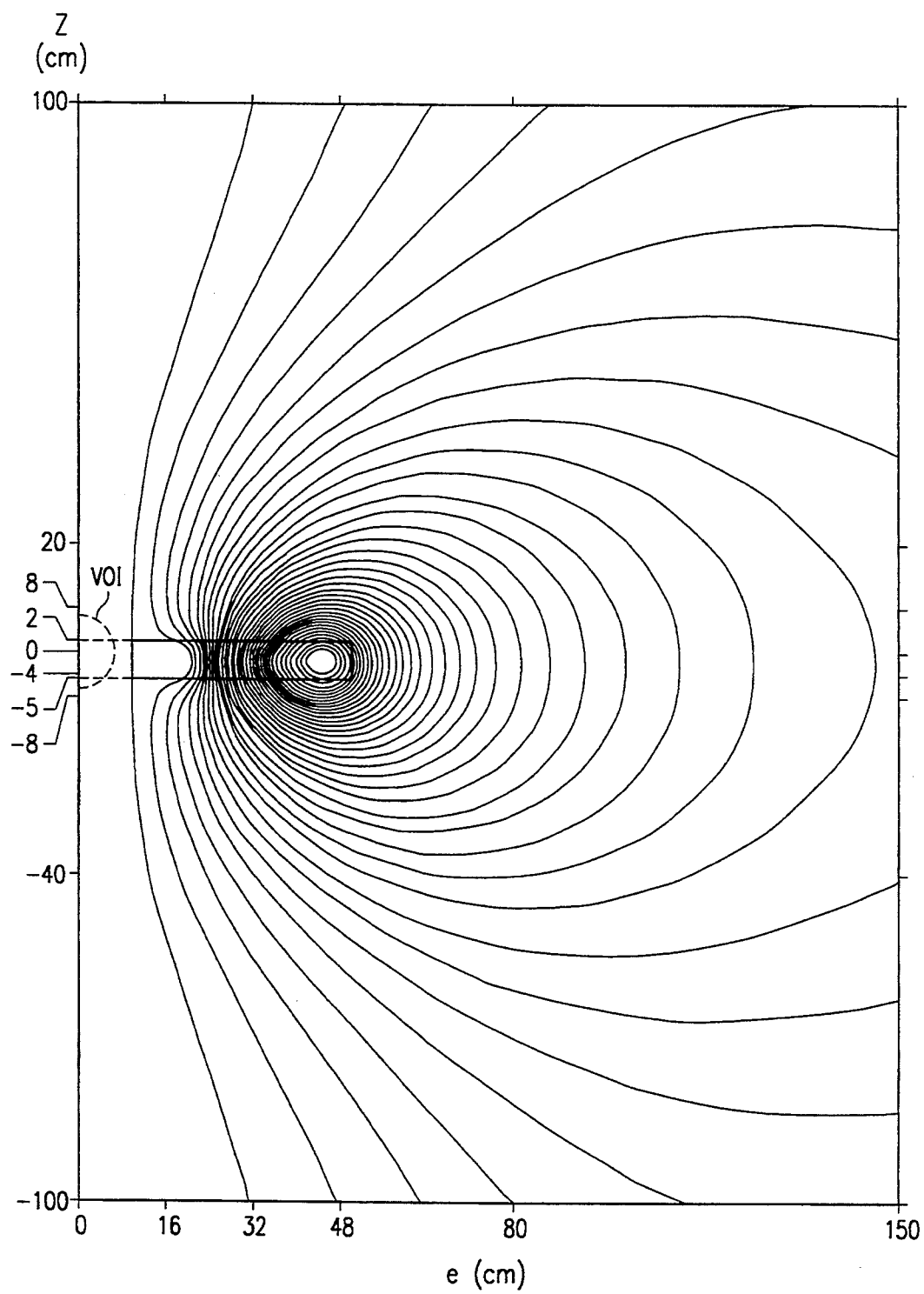
FIG. 10 is a diagram illustrating the lines of field produced by the unshielded magnet of FIG. 6.

FIG. 10 illustrates the field lines as modeled by the OPUS finite element modeling program noted above, for the construction of magnet 20 described hereinabove relative to FIG. 9. For this unshielded version of magnet 20, a 10 kgauss field is produced within the VOI with a uniformity of approximately 7 ppm (before shimming). The 5 gauss line is approximately 4 meters from the side of magnet 20 (i.e., perpendicular from the outer diameter of cryostat 22), and approximately 5.5 meters from the front and back surfaces (i.e., parallel with the axis of bore 24). The overall superconductor required for magnet 20 is modeled to be 4195 kA-meters, which is significantly less than a conventional 10 kgauss cylindrical superconducting whole-body MRI magnet, which requires on the order of 12,000 kA-meters of superconductor.

Figure 11:
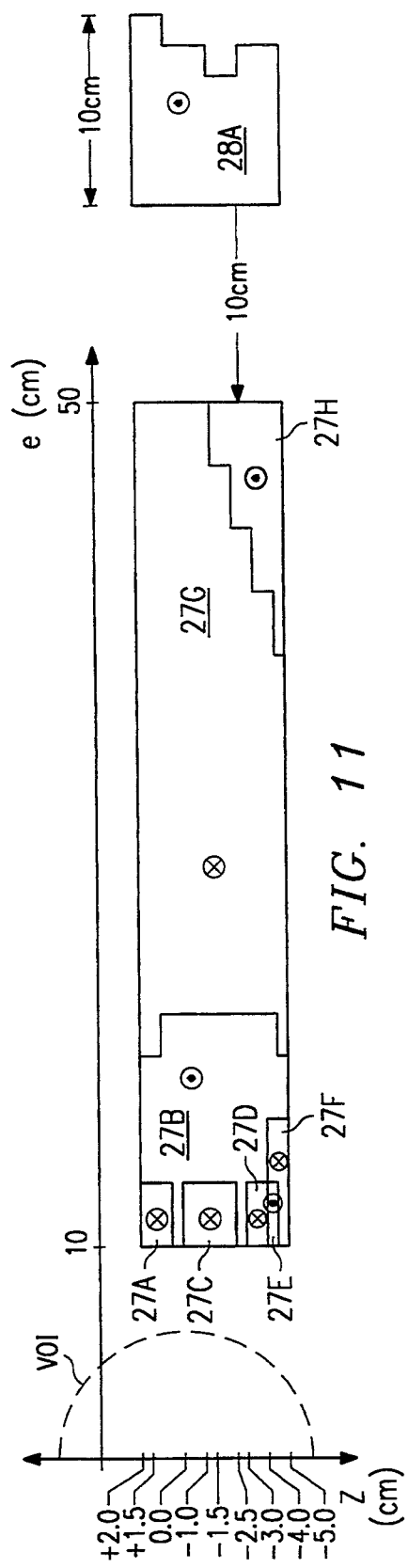
FIG. 11 is a cross-sectional schematic diagram of the coils in the magnet of FIG. 6 according to an actively shielded version thereof.

While magnet 20 of FIG. 9 provides a relatively low level of fringe field away therefrom, the fringe field may be further reduced by providing active shielding coils similarly as described in the above-referenced copending application Ser. No. 869,544, such shielding coils also being preferably designed according to the structured coils methodology described hereinabove. FIG. 11 illustrates the arrangement of such an actively shielded magnet, including primary coil assembly 27 with coils 27A through 27H therein, in combination with shielding coil assembly 28 with shielding coil 28A therewithin. Shielding coil assembly 28 is separated from primary coil assembly 27 along the midplane thereof, for example by a distance of 10 cm. Both primary coil assembly 27 and shielding coil 28 are preferably contained within a single cryostat (not shown), as each contain similarly constructed superconducting wire.

In theory, the provision of shielding coil 28A effectively creates a quadrupole magnet, where primary coils 27A through 27H are responsible for generating the high uniformity field in the VOI, and where shielding coil 28A, carrying opposite polarity current from the net current of primary coils 27A through 27H, is intended to cancel the magnetic dipole moment outside of the VOI (at least outside of the diameter of primary coil assembly 27). As is well known for quadrupole magnets, the stray field decays as a function of $\rho^{-4}$, $\rho$ being the distance from the axis of bore 24.

The structured coils methodology described hereinabove is again applied to the z-$\rho$ plane coil elements in primary coil assembly 27 and shielding coil assembly 28 in order to arrive at the optimum coil size, shape and location, as well as the total current therethrough. In addition to optimization of the uniformity of the field in the VOI, as described above and in copending application Ser. No. 869,544, the design of an actively shielded magnet according to the structured coils methodology incorporates the use of target points outside of the VOI, so that the shielding coil current, size and shape may be optimized to reduce the field at the target points outside of the VOI while not affecting the uniformity of the field within the VOI. As described in this copending application, the design of an actively shielded magnet according to the structured coils methodology is facilitated by using a weighting factor in the error form to comprehend the tradeoff between high uniformity field in the bore B versus low fringe effects. Accordingly, the error form Q minimized in the design of actively shielded magnet 20 according to this embodiment of the invention is as follows:

$$Q = \sum_{i=1}^{j} W_i(B_{zi} - B_f)^2 + \sum_{i=j+1}^{k} p(B_{\rho i}^2 + B_{zi}^2)$$

where the set of $w_i$ is a set of weighting factors for weighting the effect of the j target locations within bore 24, where the difference $(B_{zi} - B_f)$ is the difference between the calculated field and the desired field at the ith target location in bore 24, and where $(B_{\rho i}^2 + B_{zi}^2)$ is the square of the amplitude of the field (radial and axial components) at the [k-(j+1)] target locations outside bore 24 for which the fringe field is determined. The weighting factor p indicates the tradeoff between highest bore field quality (p=0) and best shielding (p large). Empirical study has indicated that a value of $10^{-6}$ to $10^{-5}$ is suitable for magnets to be used in MRI applications.

An example of this design of an actively shielded magnet 20 according to this embodiment of the invention, and illustrated in FIG. 11. The polarity convention of cross-in-circle and dot-in-circle illustrated in FIG. 11 is the same as in the examples discussed hereinabove. The total current values for primary coils 27A through 27H, and shielding coil 28A, in this example of shielded magnet 20 are as follows:

| Coil | Current (kA) |
| --- | --- |
| 27A | 51.79 |
| 27B | −742.38 |
| 27C | 80.34 |
| 27D | 40.03 |
| 27E | −17.78 |
| 27F | 53.34 |
| 27G | 1879.48 |
| 27H | −284.48 |
| 28A | −493.36 |

The current density for coils 27A through 27H is approximately 8.00 ka/cm², and the current density for shielding coil 28A is approximately 10.00 kA/cm² each current density being easily conducted by conventional niobium/titanium alloy superconducting wire, with adequate room for copper stabilizers, cryogenic fluid conduit grooves, structural metal banding, and quench protection elements, each conventional in the art. As in the case discussed above, the current density of coils 27A through 27H is substantially constant thereacross.

Figure 12:
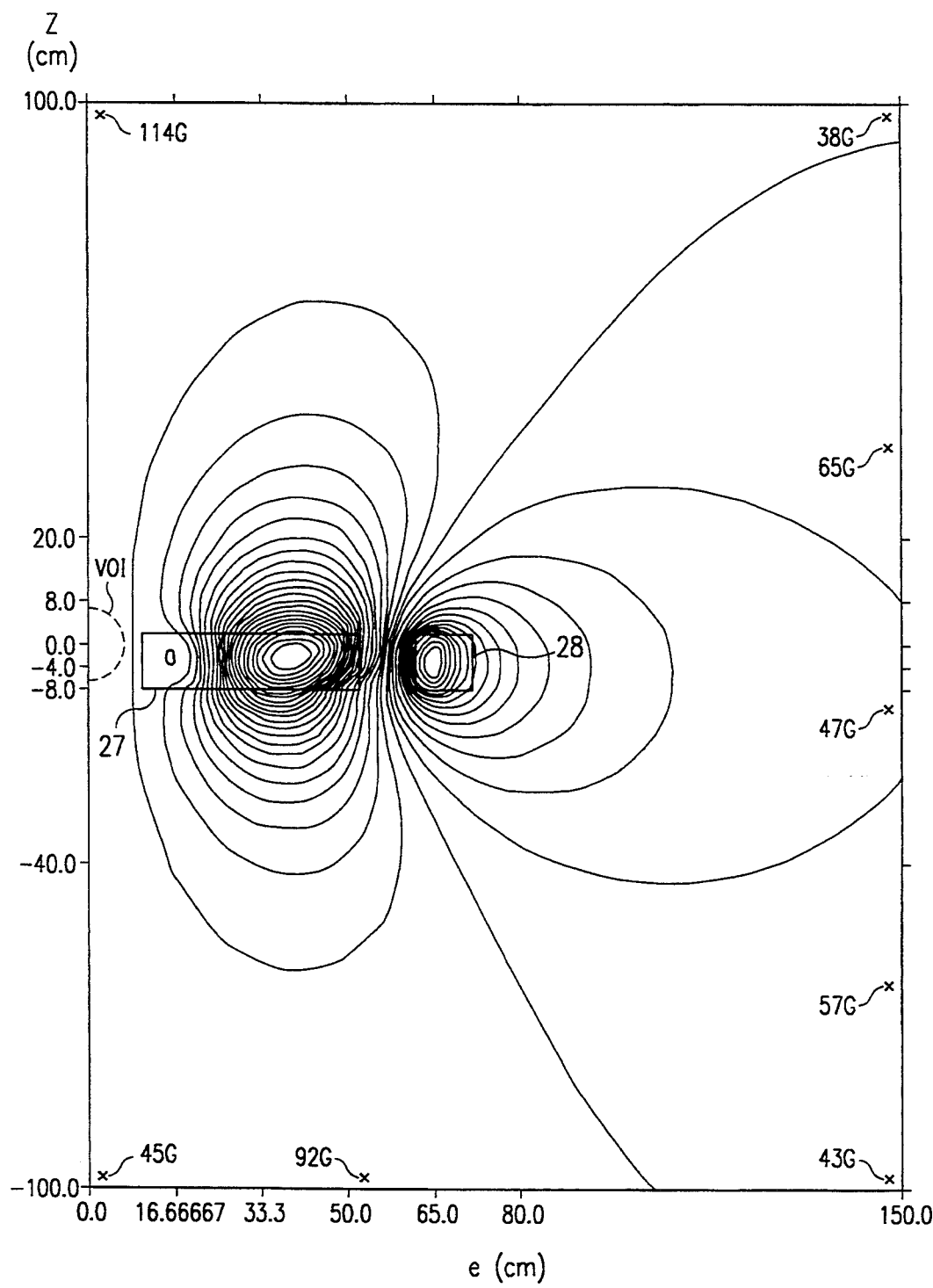
FIG. 12 is a diagram illustrating the lines of field produced by the magnet of FIG. 6 according to the shielded version of FIG. 10.

As modeled by the OPUS finite element computer modeling program, the construction of shielded magnet 20 as shown in FIG. 11 provides field lines as illustrated in FIG. 12. This modeling indicates that the 5 gauss line is only 2.5 meters from the outer diameter of shielding coil assembly 28 (which itself is approximately 75 cm from the axis of bore 24), and only 2.2 meters from the front and back faces of magnet 20. The total amount of superconductor required for this shielded magnet 20 is approximately 5980 kA-meters, which is still quite efficient for a 10 kGauss field strength. The overall size of shielded magnet 20 is approximately 1.5 meters in diameter and 15 cm thick, and the contemplated weight is less than 1000 pounds, again providing a relatively portable high strength DC magnet for MRI systems.

Of course, a tradeoff between superconductor amount and shielding efficiency is available, as one may obtain somewhat less shielding but save significantly in the amount of superconductor and cryogenics required. It is contemplated, therefore, that one of ordinary skill in the art will be able to design a bagel-shaped magnet having the superconductor amount and fringe field shielding suitable for a particular application.

Further in the alternative, one may utilize iron shielding for the bagel shaped magnet 20 of this embodiment of the invention. It is contemplated that such iron shielding, while effective, would strongly tend to reduce the benefits of portability otherwise available for magnet 20 according to this embodiment of the invention, and as such will generally be less desirable in that sense; such a magnet would, of course, still provide the important benefits of enabling the imaging of a human externality without requiring insertion of the patient's whole body into the magnet bore, as in conventional cylindrical magnets.

Furthermore, while magnet 20 described hereinabove has its VOI offset from the midplane of the magnet, it is contemplated that selection of the location of the VOI along the axis of bore 24 may be made in the structured coils design by one of ordinary skill in the art having reference to this description. Selection of the location of the VOI along this axis may be made in the design of the magnet according to this embodiment of the invention.

In summary, the design of the uniform high field DC magnet according to this embodiment of the invention tailors the volume of interest to that of the externality to be imaged, such as the female breast. As a result, and particularly when utilizing the structured coils methodology described hereinabove, the magnet may be optimized to provide a highly uniform field in the limited VOI in a manner which dramatically improves the cost, weight, and size of the DC magnet. The magnet according to this embodiment of the invention also allows for the patient to remain outside of the magnet bore, greatly reducing patient anxiety and maximizing access to the patient by medical personnel. In addition, by maintaining the head of the patient outside of the magnet bore, the effect of gradient coil noise on the patient is much reduced, further reducing patient anxiety from that experienced in conventional cylindrical whole-body magnets.

Furthermore, even for such a small magnet as that according to this embodiment of the invention, the stray field may be contained quite successfully, without requiring excessive amounts of superconductor, and indeed allowing for the designer to trade-off stray field control against superconductor cost.

Helmet-shaped Magnet for MRI of the Head

Figure 13:
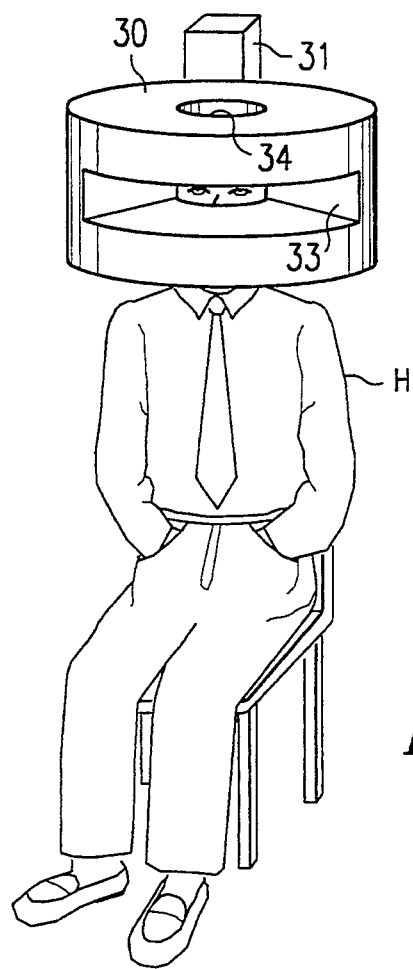
FIG. 13 is a perspective view of a magnet according to a third embodiment of the invention.

Referring now to FIG. 13, magnet 30 according to a third embodiment of the invention will now be described in detail. As discussed above, the NMR tomography of the human head area, in particular the brain, is often necessary to determine the extent of injuries thereof and tumors therein. Another important use of brain MRI is during psychotherapeutic procedures, where the psychiatrist provides a visual stimulus to the patient and observes the brain activity response to the stimulus by way of MRI.

Prior MRI systems incorporating solenoid-shaped magnets have been the primary design used in generating the 5 kgauss or greater magnetic fields necessary for adequate MRI of internal organs, but have required whole-body insertion of the patient into the cylindrical magnet bore. Such insertion can result in a relatively high degree of patient anxiety. In addition, especially where the head is to be imaged, the noise produced by the gradient coil switching is quite frightening to many patients, increasing the level of anxiety from that already presented by the magnet "tunnel". Furthermore, the cylindrical magnets obstruct the vision of the patient, making their use for MRI of brain activity in response to visual stimulus in the psychotherapeutic context cumbersome, if not impossible.

According to this third preferred embodiment of the invention, magnet 30 is provided which is specifically designed for MRI of the head and brain, and which takes advantage of the limited volume of interest (VOI) required for such imaging. A very high DC magnetic field (on the order of 20 kgauss) is provided by this magnet 30, highly uniform over a limited VOI corresponding to the size of the human head, and without requiring the whole body insertion of conventional cylindrical magnets.

Referring to FIG. 13, patient H is shown within magnet 30 according to this embodiment of the invention. Magnet 30 includes cryostat 32 which has bore 34 therethrough of sufficient size (e.g., 20 cm) for patient H to insert his head from below. Magnet 30 is supported from behind by support 31, so that magnet 30 remains in a relatively fixed location; an adjustment mechanism (not shown) such as a worm gear or chain drive may be provided in support 31 to allow for the height of magnet 30 to match the sitting height of patient H. Also provided in magnet 30 is a viewing gap 33, so that the vision of patient H is not obstructed, enabling visual contact between patient H and personnel outside of magnet 30, such as a psychiatrist in the psychotherapeutic context noted above. Furthermore, outside of the psychotherapeutic application, since a certain degree of patient anxiety may be due to obstruction of the patient's vision, gap 33 serves to greatly reduce such anxiety.

The size of magnet 30 is on the order of 60 cm in outside diameter and 35 cm in height. Its field strength is contemplated to be on the order of 20 kgauss (2.0 Tesla), substantially uniform (<10 ppm) over a VOI of on the order of 20 cm in diameter approximately centered within bore 34 of magnet 30. The overall weight is contemplated to be on the order of 1000 pounds. As such, the construction of magnet 30 according to this embodiment of the invention also provides a substantially portable magnet, such that the MRI system into which magnet 30 is implemented may be deployed by way of mobile vehicle (such as a mobile MRI screening truck), ship, and the like, including use in space travel.

As discussed above relative to magnets 2 and 20, it is of course to be understood that the remainder of the overall MRI system will be provided in combination with magnet 30, as magnet 30 is intended to provide the large DC magnetic field necessary in NMR tomography. As such, the gradient and RF coils for generating the gradient and oscillating fields, respectively, within the VOI, and the detecting coils for detecting the response of gyromagnetic nuclei in the VOI to the magnetic fields applied thereto, will be provided in combination with magnet 30 to complete the MRI apparatus. As is well known in the art, the volume required for these additional coils is relatively small, and as such the representation presented in FIG. 13 is contemplated to be substantially accurate in illustrating the relative position of patient H to magnet 30. The design of these particular additive elements will depend, of course, upon the particular MRI system design desired, and it is contemplated that one of ordinary skill in the art will be able to provide such additional features to magnet 20, according to this embodiment of the invention, by utilizing conventional technology. The Pissanetzky *Meas. Sci. Technol.* article incorporated by reference hereinabove is indicative of such conventional technology in the field of gradient coil design.

Figure 14:
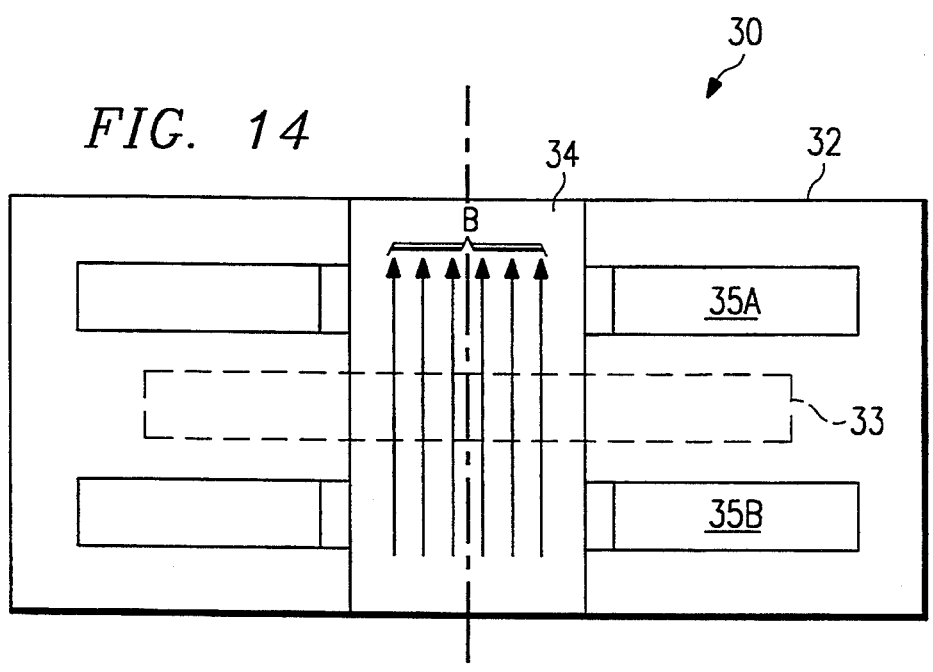
FIG. 14 is a cross-sectional schematic diagram of the magnet of FIG. 12.

Referring now to FIG. 14, the construction of magnet 30 will now be described in further detail. As shown in FIG. 14, magnet 30 is preferably of the superconducting type, and as such includes coil assembly pairs 35A and 35B disposed within cryostat 32. The orientation of the conduction of net current in coil assembly pairs 35A, 35B is in a circular direction about the axis of bore 24, and in the same direction relative to one another, so that for a counter-clockwise net current, the orientation of magnetic field B is upward as shown in FIG. 14.

Cryostat 32 is of conventional construction, such as 304 L stainless steel, of sufficient strength to allow for its interior to be pumped down to the desired vacuum when chilled to superconducting temperatures, and to provide the desired structural support for the bobbins within which the superconducting coils wire is placed and also the ducting of the cryogenic coolant. Conventional cryogenic compressor equipment (not shown) is connected to cryostat 32 by way of conventional ducting, to maintain its interior at superconducting temperatures. In addition, the superconducting wire in coil assembly 25 of magnet 20 is contemplated to be of the conventional niobium titanium alloy type, such as the SCOK cable discussed above, which is of the known Rutherford type of rectangular cross-section with kapton insulation. As such, the temperature at which cryostat 22 must maintain coil assembly 25 is on the order of 4.2° K.

Alternatively, it is contemplated that conventional wire conductors (i.e., non-superconducting) may be utilized within magnet 30, resulting in a very inexpensive system amenable for widespread use. Of course, the current capacity of non-superconducting wire is substantially limited relative to that of superconducting wire, which will likely limit the field strength available for magnet 30. It is therefore preferred that magnet 30 be superconducting.

Figure 15:
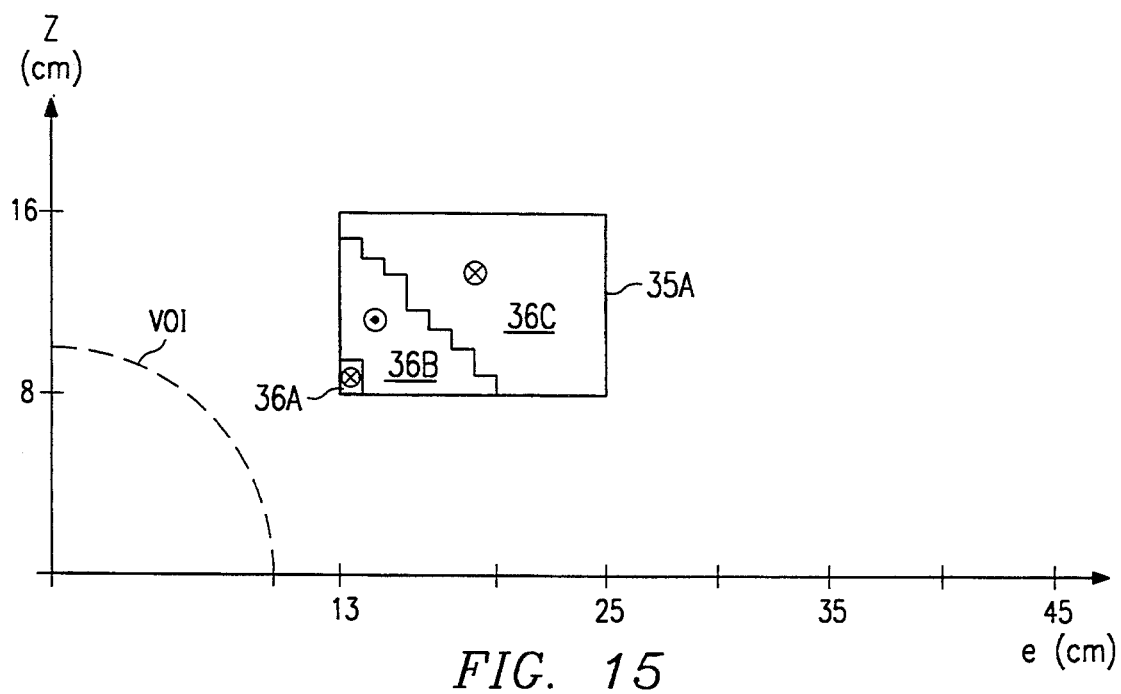
FIG. 15 is a cross-sectional elevation of the coils in the magnet of FIG. 12, according to an unshielded version thereof.

Referring now to FIG. 15, the arrangement of coils 36A through 36C within upper coil assembly 35A will be described in detail relative to an unshielded version of magnet 30. As described hereinabove relative to magnets 2, 2' 20 coil assembly 35 includes a plurality of coils 35A through 35C, each of which presents a different value of total current of varying polarity in magnet 30 to provide a highly uniform magnetic field B within the VOI. The illustration of FIG. 15 is for the upper-right-hand quadrant of magnet 30 as shown in FIG. 14. Coils 36A through 36C will be symmetric both about the axis of bore 34 (the $\rho=0$ axis) and also about the $z=0$ midplane. Accordingly, FIG. 15 is representative of the overall construction of both coil assemblies 35A, 35B in magnet 30.

The design of coils 36A through 36C is, as in the embodiments described hereinabove, preferably accomplished by way of the structured coils methodology, in which the current polarity and magnitude for discrete positional elements of coil assemblies 35A, 35B (in the $z$-$\rho$ plane as shown in FIG. 15) are adjusted relative to maximizing the uniformity of field in the VOI at the desired magnitude. As noted above, the structured coils methodology often results in coil elements carrying their maximum or minimum current density (depending on polarity), with a significant degree of clustering.

For the example of a 20 kgauss field in the VOI generated by magnet 30 having the dimensions described hereinabove, coils 36A through 36C have the shape illustrated in FIG. 15, as optimized according to the structured coils methodology. The polarity of current flow within each of coils 36A through 36C is indicated by cross-within-circle for current into the page (coils 36A and 36C) and by a dot-within-circle for current out of the page (coil 36B), generating a magnetic field in the $+z$ direction (upward in FIG. 15). The current density magnitude resulting from this methodology is approximately 16.0 kA/cm$^2$, and is substantially constant across each of coils 36A through 36C. This low current density allows the use of conventional niobium-titanium alloy superconducting wire, while providing a great deal of room for copper stabilizer, cryogenic coolant conduction grooves, structural steel banding, and conventional quench protection elements, within coil assemblies 35A, 35B. To generate a 20 kgauss field within the VOI, the total current (current density times cross-sectional area of the coil) within each of coils 36A through 36C in this example are as follows:

| Coil | Current (kA) |
|------|--------------|
| 36A  | 19.20        |
| 36B  | -297.40      |
| 36C  | 825.60       |

Figure 16:
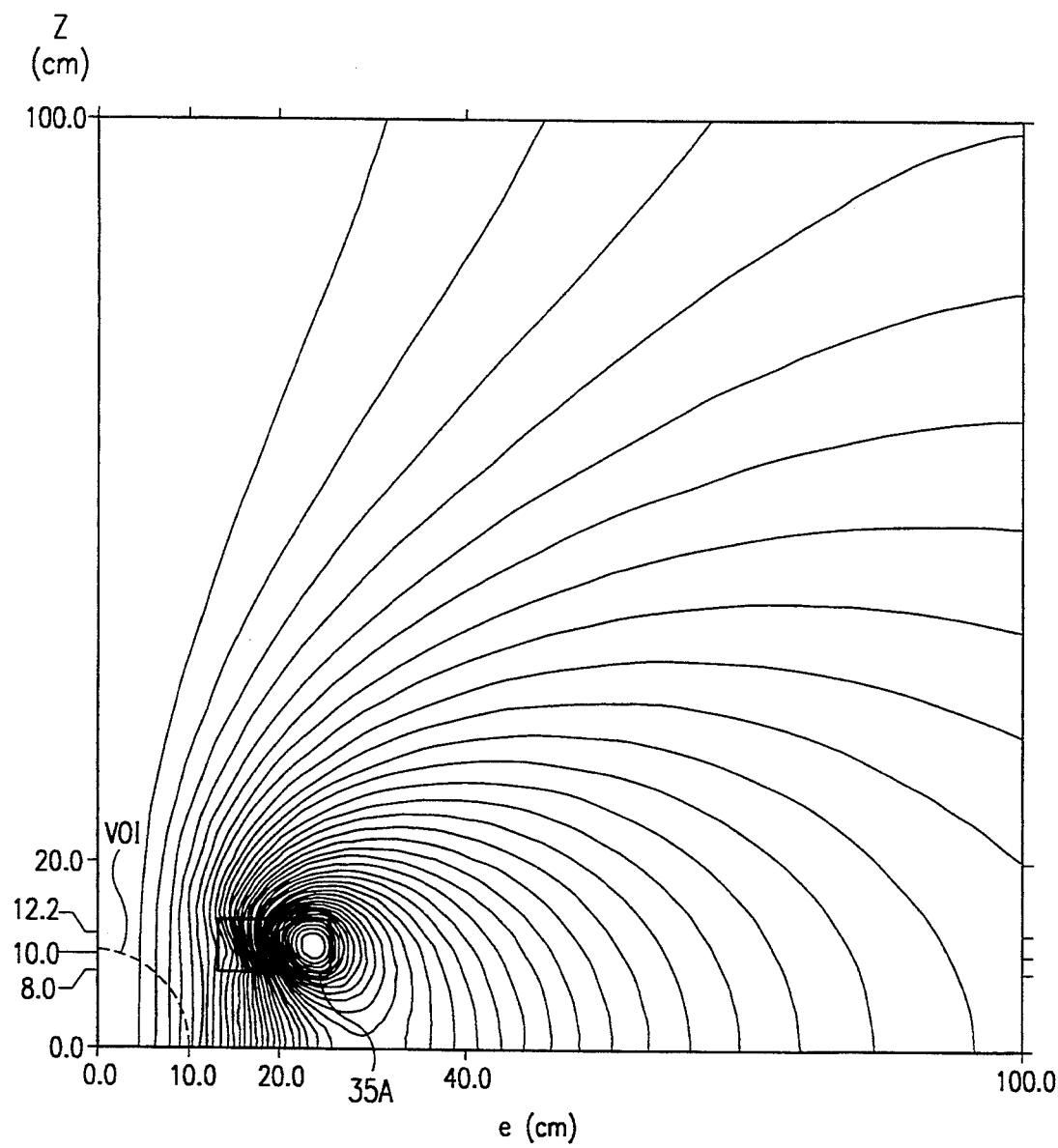
FIG. 16 is a diagram illustrating the lines of field produced by the unshielded magnet of FIG. 14.

FIG. 16 illustrates the field lines as modeled by the OPUS finite element modeling program noted above, for the construction of magnet 30 described hereinabove relative to FIG. 15. For this unshielded version of magnet 30, a 20 kgauss field is produced within the VOI, with a uniformity of approximately 7 ppm (before shimming). The 5 gauss line is approximately 2.5 meters from the side of magnet 30 (i.e., perpendicular from the outer diameter of cryostat 32), and approximately 4.3 meters from its top and bottom surfaces (i.e., parallel with the axis of bore 34). The overall superconductor required for magnet 30 is modeled to be approximately 2732 kA-meters, which is significantly less than a conventional 20 kgauss cylindrical superconducting wholebody MRI magnet, which requires at least 24,000 kA-meters of superconductor.

Figure 17:
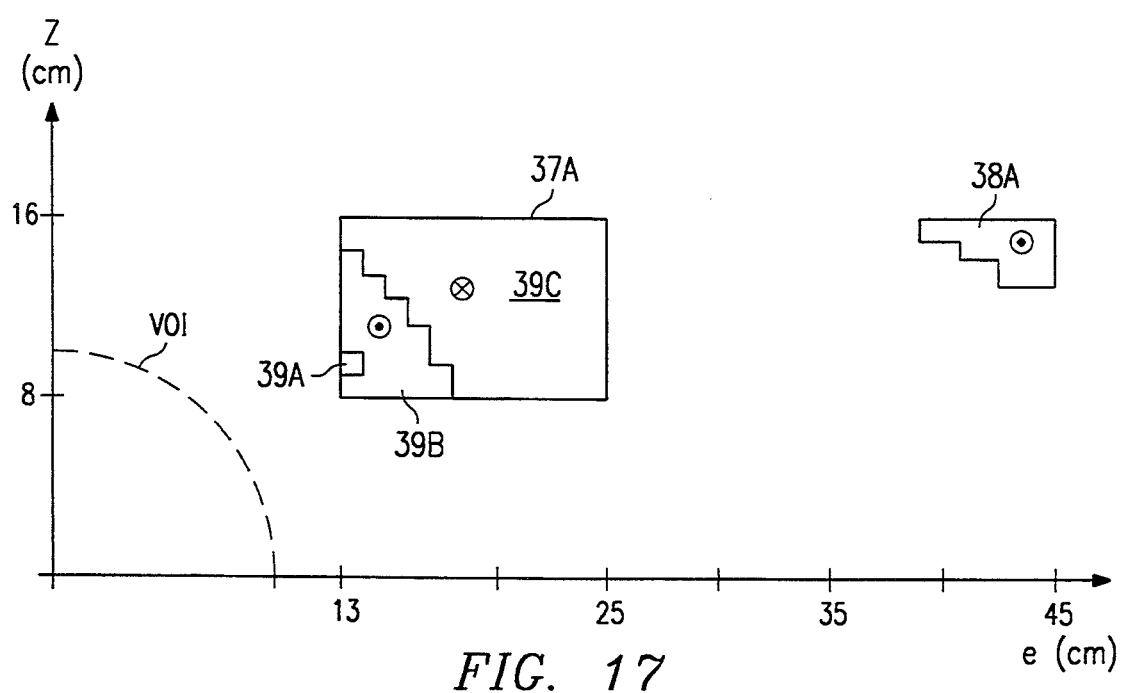
FIG. 17 is a cross-sectional schematic diagram of the coils in the magnet of FIG. 12 according to an actively shielded version thereof.

While the stray field produced by magnet 30 of FIG. 15 is relatively low level, the stray field may be further reduced by providing active shielding coils similarly as described in the above-referenced copending application Ser. No. 869,544, such shielding coils also being preferably designed according to the structured coils methodology described hereinabove. FIG. 17 illustrates the arrangement of such an actively shielded magnet (relative to a quarter magnet, symmetric about the $\rho=0$ axis and the $z=0$ plane) including primary coil assembly 37A with coils 39A through 39C therein, in combination with shielding coil 38A. Shielding coil 38A is separated from primary coil assembly 37A in a direction parallel the midplane thereof, for example by a distance of 10 cm. Both primary coil assembly 37A and shielding coil 38A are preferably contained within the same cryostat (not shown in FIG. 17), as each contain similarly constructed superconducting wire.

As in the shielded case of magnet 20 discussed hereinabove, the provision of shielding coil 38A effectively creates a quadrupole magnet, with primary coils 39A through 39C responsible for generating the high uniformity field in the VOI, with shielding coil 38A cancelling the magnetic dipole moment outside of primary coil assembly 37A so that the field decays as a function of $\rho^{-4}$ outside of cryostat 32. The design of the shape, size, location and current in each of coils 39A through 39C and 38A is preferably accomplished by way of the structured coils methodology described hereinabove, again utilizing a weighting factor to effect a tradeoff between highest bore field quality and best shielding.

An example of this design of an actively shielded magnet 30 according to this embodiment of the invention is illustrated in FIG. 17. The polarity convention of cross-in-circle and dot-in-circle illustrated in FIG. 17 is the same as in the examples discussed hereinabove. The total current values for primary coils 39A through 39C, and shielding coil 38A, in this example of shielded magnet 30 are as follows:

| Coil | Current (kA) |
|------|--------------|
| 39A  | 6.03         |
| 39B  | -256.04      |
| 39C  | 883.20       |
| 38A  | -151.42      |

The current density for coils 39A through 39C, and for shielding coil 38A, is also approximately 16.0 ka/cm$^2$, again readily conducted by conventional niobium/-titanium alloy superconducting wire, with adequate room for copper stabilizers, cryogenic fluid conduit grooves, structural metal banding, and quench protection elements, implemented in the conventional manner.

Figure 18:
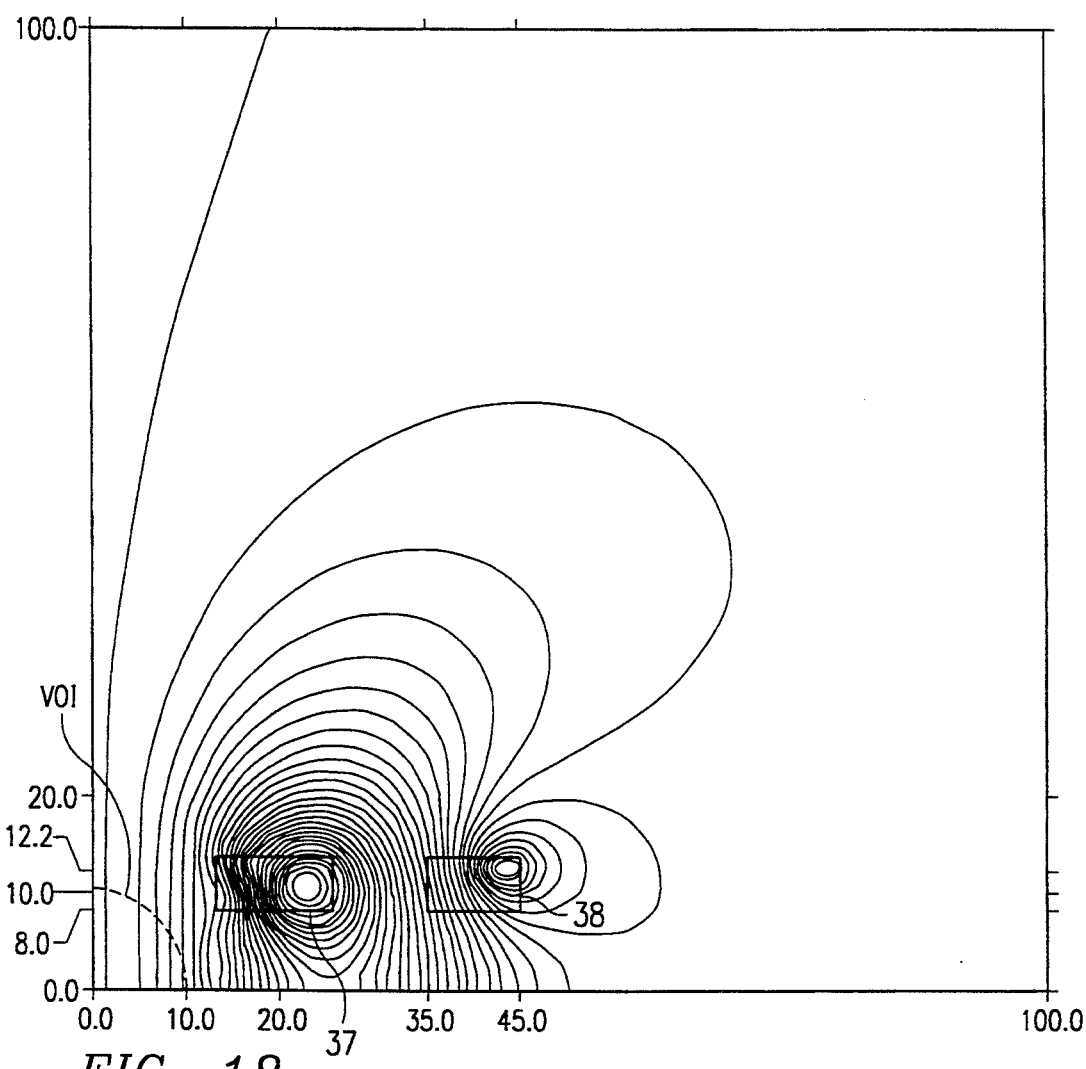
FIG. 18 is a diagram illustrating the lines of field produced by the magnet of FIG. 12 according to the shielded version of FIG. 16.

As modeled by the OPUS finite element computer modeling program, the construction of shielded magnet 30 as shown in FIG. 17 provides field lines as illustrated in FIG. 18. This modeling indicates that the 5 gauss line is only 70 cm from the outer diameter of shielding coil assembly 28 (which itself is approximately 45 cm from the axis of bore 34), and only 2.0 meters from the top and bottom faces. The total amount of superconductor required for this shielded magnet 30 is approximately 3556 kA-meters, which is still quite efficient for a 20 kGauss field strength. The overall size of shielded magnet 20 is approximately 1.0 meters in diameter and 35 cm thick, and the contemplated weight is less than 1000 pounds, again providing a relatively small and inexpensive high strength DC magnet for MRI systems.

As in the case of bagel-shaped magnet 20, one may tradeoff superconductor amount with shielding efficiency, saving superconductor and cryogenic cost at the expense of poorer stray field shielding. Also as in the case of magnet 20, iron shielding may also be utilized for magnet 30 according to this embodiment of the invention, at the expense of added weight and size, while still obtaining the other benefits of magnet 30.

Uniform high field DC magnet 30 according to this embodiment of the invention thus also tailors the volume of interest to that of the head area, while removing the obstruction to vision presented by conventional cylindrical magnets. In combination with the benefit that the whole body need not be inserted into a magnet bore, the present invention thus provides a high DC field for NMR tomography with minimal patient discomfort, and maximum access to the patient by medical personnel. The effect of gradient coil noise on the patient is much reduced by the magnet according to this embodiment of the invention, further reducing patient anxiety from that experienced in conventional cylindrical whole-body magnets.

Furthermore, the structured coils methodology described hereinabove further allows optimization of the magnet design to provide a highly uniform field in the VOI with greatly reduced cost, weight, and size of the DC magnet relative to cylindrical magnets. In particular, the structured coils methodology allows for magnets to be designed which have their VOI, or region of high field uniformity, offset from the center of the magnet, in some cases having portions outside of the magnet bore. This ease of location of the VOI enables the design of magnets for the in vivo NMR tomography of human organs without requiring the whole body of the patient to be inserted into the magnet bore. Excellent stray field containment is also provided by this magnet design, by either iron or active shielding, without requiring excessive amounts of superconductor material.

In addition, while the above-described magnets are of the cylindrical type, the method of fabricating a magnet according to the present invention described above is also applicable to magnets of other symmetry. As noted above, long magnets of the type used in particle accelerators, in which the ends of the magnets (in the direction of their length) are effectively infinitely distant from points within the bore because the ends do not affect the field within the bore, may also be designed according to the present invention. This is because each cross-section in the plane perpendicular to the axis of the bore is identical to all others in such long magnets, allowing this method to be applied in the design by considering one of the plane cross-sections therein.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

What is claimed is:

1. A method of fabricating an electromagnet, comprising the steps of:
    defining a volume of interest;
    selecting a magnetic field magnitude to be produced in said volume of interest;
    defining a region near said volume of interest within which non-zero zero current density is allowable, and represented as a two-dimensional array of elemental areas;
    determining the magnitude and polarity of the current density for each of the elemental areas within the defined region in order to produce the selected magnetic field magnitude in the volume of interest, in such a manner that substantially the same magnitude and polarity of current density is determined for at least one cluster of elemental areas; and
    constructing at least one coil for carrying current at locations and at magnitudes corresponding to the result of the determining step.

2. The method of claim 1, wherein said elemental areas correspond to elemental cross-sectional areas of loops about said volume of interest.

3. The method of claim 1, wherein said elemental areas correspond to elemental cross-sectional areas of long bars extending normal to a plane cross-section of said volume of interest.

4. The method of claim 1, wherein the determining step comprises:
    selecting a current density limit for said elemental areas;
    selecting a target value of magnetic field for a plurality of target locations;
    modeling the field produced by the selected current magnitude and polarity for said elemental areas;
    calculating the difference between the modeled field and the target value of magnetic field at each of said plurality of target locations to derive a quadratic error form;
    adjusting the selected current density magnitude and polarity values for said elemental areas within said current density limit according to constrained quadratic optimization of said quadratic error form.

5. The method of claim 4, wherein said adjusting step comprises:
    iteratively performing simplex minimization of said quadratic error form.

6. The method of claim 4, wherein said plurality of target locations comprise target locations within said volume of interest.

7. The method of claim 6, wherein said plurality of target locations comprise target locations at the perimeter of said volume of interest.

8. The method of claim 6, wherein said plurality of target locations further comprise target locations disposed outside of the location of said coil elements.

9. The method of claim 4, wherein said step of calculating the difference comprises
    calculating the zonal harmonic coefficients in the field.

10. The method of claim 4, further comprising:
    after said minimizing step, calculating the magnetization of iron surrounding the defined region;
    and wherein said modeled field further includes the field produced by said magnetization.

11. The method of claim 4, further comprising:
defining current density limits for each of said elemental areas.

12. The method of claim 11, wherein said current density limits correspond to superconducting current densities.

13. The method of claim 1, wherein said defining step comprises:
defining a first array of primary elemental areas near said volume of interest; and
defining a second array of shielding elemental areas disposed outside of the first array of primary elemental areas relative to said volume of interest.

14. The method of claim 1, further comprising:
after the determining step, adjusting the location of the region relative to the volume of interest;
after the adjusting step, repeating the determining step for the elemental areas in the defined region at its adjusted location;
calculating the field in the volume of interest after said adjusting and repeated determining steps; and
repeating said adjusting, determining and calculating steps until the difference between the calculated field and desired field reaches a tolerance limit.

15. The method of claim 1, wherein at least one cluster has a non-rectangular cross-sectional area.

16. The method of claim 1, wherein at least one cluster has a rectangular cross-sectional area.

17. An electromagnet, comprising:
at least one coil for conducting current encircling a bore, wherein the current conducted at a plurality of locations therewithin is determined by a method comprising the steps of:
defining a volume of interest;
selecting a magnetic field magnitude to be produced in said volume of interest;
defining a region within which non-zero current densities are allowed, and comprised of a two-dimensional array of elemental areas; and
determining the magnitude and polarity of current density for each of said elemental areas to produce the selected magnetic field magnitude in the volume of interest, in such a manner that substantially the same magnitude and polarity of current density is determined for at least one cluster of elemental areas within the defined region, each cluster defining the shape, position, and current of a corresponding coil.

18. The magnet of claim 17, wherein the determining step comprises:
selecting a current density limit for said elemental areas;
selecting a target value of magnetic field for a plurality of target locations;
modeling the field produced by the selected current density magnitude and polarity for said elemental areas;
calculating the difference between the modeled field and the target value of magnetic field at each of said plurality of target locations to derive a quadratic error form;
adjusting the selected current density magnitude and polarity values for said elemental areas within said current density limit according to constrained quadratic optimization of said quadratic error form.

19. The magnet of claim 17, wherein the method further comprises:
after the determining step, adjusting the location of the defined region;
after the adjusting step, repeating the determining step for the elemental areas in the defined region at its adjusted location;
calculating the field in the volume of interest after said adjusting and repeated determining steps; and
repeating said adjusting, determining and calculating steps until the difference between the calculated field and desired field reaches a tolerance limit.

20. The magnet of claim 17, further comprising:
means for shielding stray field produced by the coil.

21. The magnet of claim 20, wherein said shielding means comprises a shielding coil disposed outside of said coil relative to said volume of interest.

22. The magnet of claim 17, wherein said shielding means comprises:
an iron shield surrounding the coil.

23. The magnet of claim 20, wherein the determining step comprises:
selecting a current density limit for said elemental areas;
selecting a target value of magnetic field for a plurality of target locations;
modeling the field produced by the selected current magnitude and polarity for said elemental areas;
calculating the difference between the modeled field and the target value of magnetic field at each of said plurality of target locations to derive a quadratic error form;
adjusting the selected current density magnitude and polarity values for said elemental areas within said current density limit according to constrained quadratic optimization of said quadratic error form;
wherein said method further comprises:
after said minimizing step, calculating the magnetization of iron surrounding the defined region;
and wherein said modeled field further includes the field produced by said magnetization.

24. The magnet of claim 17, wherein at least a portion of said volume of interest is located outside of said bore.

25. The magnet of claim 17, wherein said coil comprises superconducting wire.

26. The magnet of claim 17, wherein said coil comprises non-superconducting wire.

27. The magnet of claim 17, wherein at least one cluster has a non-rectangular cross-sectional area.

28. The magnet of claim 17, wherein at least one cluster has a rectangular cross-sectional area.

* * * * *